United States Patent
Sun et al.

(10) Patent No.: US 10,692,693 B2
(45) Date of Patent: Jun. 23, 2020

(54) SYSTEM AND METHOD FOR MEASURING PATTERNS

(71) Applicant: Hitachi High-Technologies Corporation, Tokyo (JP)

(72) Inventors: Wei Sun, Tokyo (JP); Yasunari Sohda, Tokyo (JP); Taku Ninomiya, Tokyo (JP); Yasunori Goto, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 0 days.

(21) Appl. No.: 16/161,140

(22) Filed: Oct. 16, 2018

(65) Prior Publication Data
US 2019/0148108 A1   May 16, 2019

(30) Foreign Application Priority Data
Nov. 10, 2017   (JP) .................... 2017-217327

(51) Int. Cl.
*H01J 37/28* (2006.01)
*H01J 37/244* (2006.01)

(52) U.S. Cl.
CPC ............ *H01J 37/28* (2013.01); *H01J 37/244* (2013.01); *H01J 2237/221* (2013.01);
(Continued)

(58) Field of Classification Search
CPC .... H01J 37/28; H01J 37/244; H01J 2237/221; H01J 2237/24475; H01J 2237/24578; H01J 2237/281
See application file for complete search history.

(56) References Cited

U.S. PATENT DOCUMENTS

| | | | |
|---|---|---|---|
| 6,420,702 B1* | 7/2002 | Tripsas | G01B 15/00 250/252.1 |
| 2004/0040930 A1* | 3/2004 | Tanaka | G01N 23/225 216/61 |

(Continued)

FOREIGN PATENT DOCUMENTS

| JP | 2003-517199 A | 5/2003 |
|---|---|---|
| JP | 2015-106530 A | 6/2015 |
| WO | 2017/179138 A1 | 10/2017 |

OTHER PUBLICATIONS

Korean Office Action received in corresponding Korean Application No. 10-2018-0120946 dated Sep. 10, 2019.

*Primary Examiner* — Eliza W Osenbaugh-Stewart
(74) *Attorney, Agent, or Firm* — Mattingly & Malur, PC

(57) ABSTRACT

A pattern measuring device ensures highly accurately measuring a depth and a three-dimensional shape irrespective of a formation accuracy of a deep trench and/or a deep hole. Therefore, in the present invention, the measuring system detects backscattered electrons from a pattern caused by an irradiation, compares backscattered electron signal intensities from a top surface, a bottom surface, and a sidewall of the pattern, and calculates a three-dimensional shape (or height information) of the sidewall based on a difference in heights of the top surface and the lower surface. The measuring system compares the calculated three-dimensional shape of the sidewall with a three-dimensional shape of the sidewall estimated based on an intensity distribution (open angle) of a primary electron beam, corrects the estimated three-dimensional shape of the sidewall based on a difference in the comparison, and corrects until the difference in the comparison becomes an acceptable value.

15 Claims, 16 Drawing Sheets

(52) U.S. Cl.
CPC ........... *H01J 2237/24475* (2013.01); *H01J 2237/24578* (2013.01); *H01J 2237/281* (2013.01); *H01J 2237/2815* (2013.01); *H01J 2237/2817* (2013.01)

(56) References Cited

U.S. PATENT DOCUMENTS

| | | | |
|---|---|---|---|
| 2012/0104254 A1* | 5/2012 | Shishido | H01J 37/244 250/310 |
| 2016/0379798 A1 | 12/2016 | Shishido et al. | |

* cited by examiner

SYSTEM AND METHOD FOR MEASURING PATTERNS

CROSS-REFERENCE TO RELATED APPLICATION

This application claims priority to Japanese Patent Application No. 2017-217327 filed on Nov. 10, 2017, the entire contents of which are incorporated by reference herein.

BACKGROUND

The present invention relates to a measuring system and method for patterns of, for example, a semiconductor wafer.

Semiconductor devices up to the present have been subjected to shrinkage, high integration, and the like in order to enlarge capacity of memory and reduce bit cost. Recently, high level of integration has been highly required, and development and production of devices having three-dimensional structures for substituting the miniaturization have been developed.

Changing a planar structure to a three-dimensional structure tends to cause the whole device to be thick. In association with this, a ratio (aspect ratio) of a hole and/or a trench tends to increase during a process to form the hole, the trench, and/or the like as stacked layers of films increases in a structure of, for example, a 3D-NAND and a DRAM, For example, in order to know a three-dimensional shape of the hole and/or the trench having a considerably high aspect ratio with, for example, a hole diameter of 50 nm to 100 nm and a depth of 3 μm or more, an accurate cross-sectional shape can be obtained by cutting off a wafer and measuring the cross-sectional. However, in order to examine a uniformity over a wafer, it involves a labor and a cost. Therefore, besides a top dimension and a bottom dimension of the hole, a method for non-destructively measuring a cross-sectional shape or a three-dimensional of a pattern with high accuracy is necessary.

Here, typical methods to observe the three-dimensional shape without cutting-off the wafer but with an electron microscope, for example, are roughly classified into two methods, a stereoscopic observation and a top-down observation.

For example, a stereoscopic observation described in Japanese Unexamined Patent Application Publication (Translation of PCT Application) No. 2003-517199 inclines a sample stage or an electron beam to change a relative incidence angle of the electron beam to a sample, and thus, shape measurements of, for example, a height of a pattern and an inclination angle of a sidewall are performed using a plurality of images different from an irradiation from a top surface.

Japanese Unexamined Patent Application Publication No. 2015-106530 is not effective in measuring a dimension of a bottom of a hole because detection efficiency of secondary electrons (SE, usually its energy is roughly defined to be less than 50 eV) emitted from a bottom portion decreases as an aspect ratio of a deep hole and/or a deep trench increases. Meanwhile, backscattered electrons (also referred to backscattered electrons (BSE). Usually its energy is roughly defined to be more than 50 eV) generated by primary electrons with high energy has relatively high intensity when coming out of the bottom of the hole to a sample surface, compared with the secondary electrons. Accordingly, it is effective in measuring high aspect ratio features, and therefore, there is described a method for measuring a depth of the bottom of the hole by using a phenomenon that an amount of BSE signal decreases as the hole gets deep.

A pattern with a high aspect ratio is difficult to control shapes of a sidewall and/or a bottom portion of a hole and/or a trench, and this possibly causes shapes of taper, bowing, and twisting. Therefore, not only dimensions of upper portions and lower portions of a hole and/or a trench, but also a cross-sectional shape are considered to be an important evaluation item. A uniformity over a wafer is highly required. Therefore, inspecting and measuring a uniformity, and then, feeding back to a manufacturing process of a semiconductor (for example, etching device) are the key to improve a yield.

However, Japanese Unexamined Patent Application Publication (Translation of PCT Application) No. 2003-517199 requires a measurement at a plurality of angles, and therefore, there lies a problem of, for example, an increased measurement period and/or a complicated analysis method. Moreover, since information only on edges (ends) of the pattern is obtained, a continuous three-dimensional shape cannot be measured.

Japanese Unexamined Patent Application Publication No. 2015-106530 discloses measuring a height of a bottom portion of a trench and/or a hole using a standard sample and/or measurement data whose hole depth is already known as a criteria.

That is, while Japanese Unexamined Patent Application Publication (Translation of PCT Application) No. 2003-517199 and Japanese Unexamined Patent Application Publication No. 2015-106530 describe methods for observing and/or measuring a sample in a three-dimensional structure, a solution for a deterioration in a measurement accuracy caused by a relative height and/or a continuous three-dimensional shape of an identical hole, and an intensity distribution of a primary electron beam is not considered. The primary electron beam in a scanning electron microscope has a limited convergence angle, and thus, the intensity distribution of a primary beam in a lateral direction varies with a height relative to its focal position. In particular, it is found by an experiment by the inventors that in the case of a deep hole and/or a deep trench, this effect becomes remarkable, and thus, electrons generated from a top surface, a bottom surface, and a sidewall are impossible to distinguish.

SUMMARY

The present invention is to provide a scanning electron microscope system that ensures a measurement of a cross-sectional shape or a three-dimensional shape and a pattern measuring method and a scanning electron microscope that uses the scanning electron microscope system based on these problems.

The present invention has the following configuration in order to achieve the above-described objects. A measuring device that measures a dimension of a pattern formed on a sample, and the measuring system includes an irradiation optical system, a detector, a signal intensity comparator, and a height calculator. The irradiation optical system scans and irradiates the pattern with a charged particle beam. The detector detects backscattered electrons from the pattern caused by the irradiation. The signal intensity comparator compares signal intensities of the backscattered electrons from a top surface, a lower surface, and a sidewall of the pattern. The height calculator calculates a height of an arbitrary position on the sidewall based on a result of the comparison and a difference in heights of the top surface and the lower surface.

The present invention has the following configuration as another configuration of the present invention. A measuring system that measures a dimension of a pattern formed on a sample, and the measuring system includes an irradiation optical system, a detector, an inclination mechanism, and a height calculator. The irradiation optical system scans and irradiates the pattern with a charged particle beam. The detector detects electrons from the pattern caused by the irradiation. The inclination mechanism changes a relative angle between the charged particle beam and the sample. The height calculator calculates heights from a top surface to a lower surface of the sample based on a first relative distance and a second relative distance. The first relative distance is between arbitrary respective positions at the top surface and the lower surface of the sample when the sample is scanned with the charged particle beam at a first incidence angle. The second relative distance is between arbitrary respective positions at the top surface and the lower surface of the sample when the sample is scanned with the charged particle beam at a second incidence angle.

The present invention has the following configuration as another configuration of the present invention. A measuring method for measuring a shape of a pattern formed on the sample, and the method includes: an irradiation step of scanning and irradiating the pattern with a charged particle beam; a detecting step of detecting electrons from the pattern by the irradiation; a signal intensity comparing step of comparing signal intensities of the electrons from a top surface, a lower surface, and a sidewall of the pattern; and a height calculating step of calculating a height of an arbitrary position on the sidewall based on a result of the comparison and a difference in heights of the top surface and the lower surface.

The above-described configuration ensures an accurate measurement of a cross-sectional shape or a three-dimensional shape for a three-dimensional structure, such as a deep hole and/or a deep trench.

DETAILED DESCRIPTION

Embodiments described below describe a scanning electron microscope and a measuring system that perform a measurement of a cross-sectional shape or a three-dimensional shape of a hole pattern and/or a trench pattern having a high aspect ratio using an electron beam in an observation or a measurement of, for example, a semiconductor wafer in a semiconductor manufacturing process, and a measuring method for a three-dimensional shape of a pattern using the scanning electron microscope and the measuring system. While a semiconductor wafer in which a pattern is formed is mainly used as an example of a sample, it is not limited to the pattern in the semiconductor, and any samples are included as long as the sample can be observed with an electron microscope and/or other microscopes.

First Embodiment

Device Configuration

Figure 1:
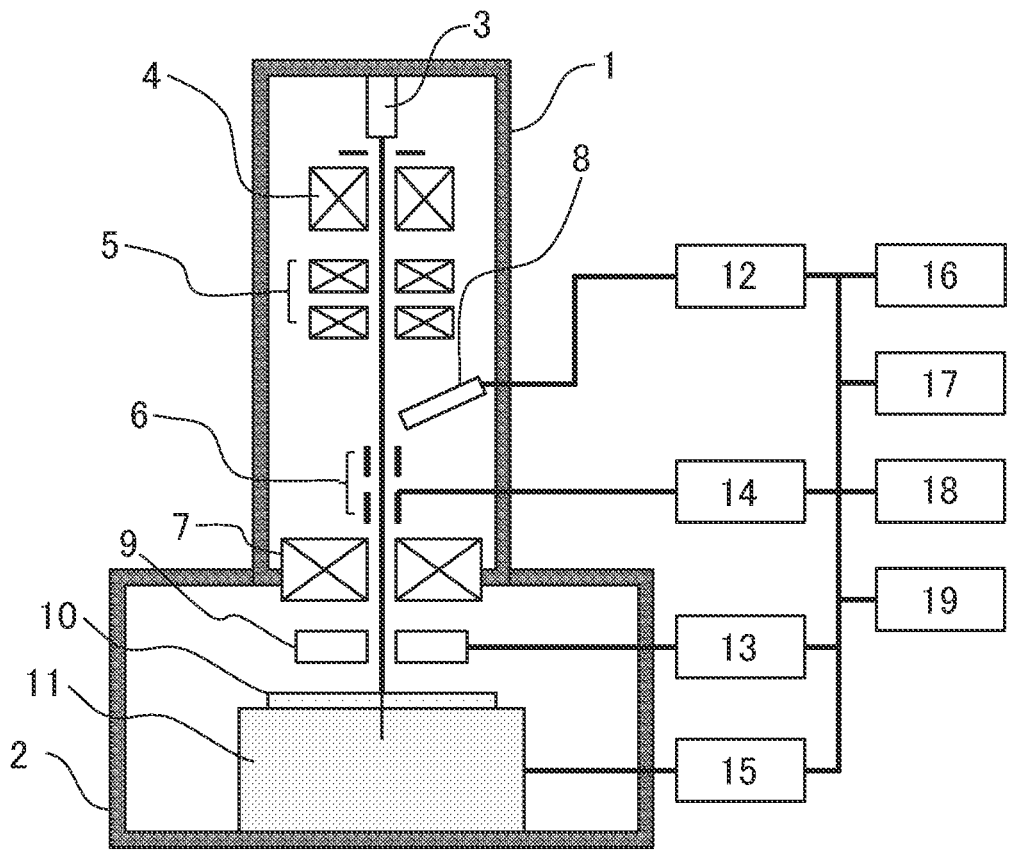
FIG. 1 is a drawing illustrating an outline of a pattern measuring system including a scanning electron microscope.

FIG. 1 illustrates a scanning electron microscope (SEM) as one aspect of a device that uses a charged particle beam in this embodiment. A scanning electron microscope main body is configured of an electron-optical column 1 and a sample chamber 2. The column 1 internally includes an electron gun 3, a condenser lens 4, a deflector 6, and an objective lens 7. The electron gun 3 is an emission source of a primary electron beam in which electrons are generated and an energy is given at a certain accelerating voltage. The condenser lens 4 focuses the electron beam. The deflector 6 scans a wafer (sample) 10 with the electron beam. The objective lens 7 focuses the electron beam and irradiates the sample with the electron beam.

Furthermore, the column 1 internally includes a deflector 5 that makes an inclined beam by displacing the electron beam off of an ideal optical axis and deflecting the off-axis beam toward a direction inclined with respect to the ideal optical axis. An XY stage 11 installed within the sample chamber moves the wafer 10 in accordance with a signal provided by a stage controller 15. The electron beam is caused to scan by the deflector 6 driven by a signal provided by an electron beam scanning controller 14. Detection signals output from an electron detector 8 and an electron detector 9 are subjected to a signal conversion in amplifiers 12 and 13, and then, are input to a processing unit 16.

In this embodiment, the detector 8 mainly detects secondary electrons generated by irradiating the sample with the electron beam and its detection signal mainly indicates pattern information on a wafer surface (top surface). The electron detector 9 detects backscattered electrons generated by irradiating the sample with the electron beam and its detection signal mainly indicates information on a lower layer of the pattern. In this embodiment, the wafer 10 is irradiated with a primary electron beam with a high energy that can reach a deep portion of a deep hole.

Furthermore, the processing unit 16 inputs, for example, a profile obtained from an obtained image to a calculation unit 17. The calculation unit 17 includes a program for calculating and/or comparing a BSE signal based on an intensity distribution of the primary electron beam and a calculation function that estimates and corrects a cross-sectional shape from the detection signal. That is, the calculation unit 17 includes a calculation unit that calculates the signal based on the intensity distribution of the primary electron, a signal intensity comparator that compares each of signal intensities, a shape calculator that estimates and corrects the cross-sectional shape and a three-dimensional shape from the detection signal, and similar unit. Even though names of units are not specified, there exist the units that correspond to processes described herein. Furthermore, it can be interpreted that the units internally includes respective interfaces (units) that control input and output. This calculation is possible to target a plurality of images obtained from a plurality of electron detectors and a plurality of incidence angles. As long as it is in a condition where the information on the lower layer of the pattern can be obtained, it does not have to be the BSE signal but, for example, the secondary electrons may be used. Furthermore, a function that associates and aggregates parameters necessary for establishing the three-dimensional shape from measurement data is incorporated. A control unit 18 comprehensively controls signal processing and/or the device. A display device 19 is coupled to the control unit 18. The control unit 18 has a function to output an image, an arithmetic operation result, and/or a measurement result to display them on the display device 19 and similar device.

In this embodiment, first, the sample is irradiated with the primary electron beam having a sufficiently high energy corresponding to a depth of a hole pattern or a trench pattern formed on a substrate. The irradiation generates the secondary electrons and the backscattered electrons by a scattering phenomenon based on an interaction between electrons entering the sample and a substance of the sample. Among these, backscattered electrons that penetrate a sidewall and are scattered throughout a sample surface are detected. When the energy of the primary electron beam is sufficient, the BSE emitted from a bottom portion of the hole passes through the surface, thereby ensuring an accurate measurement of the cross-sectional shape and/or the three-dimensional shape.

For example, in the case of a hole or a deep trench having a depth of 3 μm or more, such as a 3D-NAND and a DRAM, which are covered by the present invention, an accelerating voltage of the primary electrons is 5 kV or more, preferably, 30 kV or more. It is preferred that the backscattered electron detector is installed at a position where the BSE passing through the surface of the hole can be detected.

Principle

Figure 2:
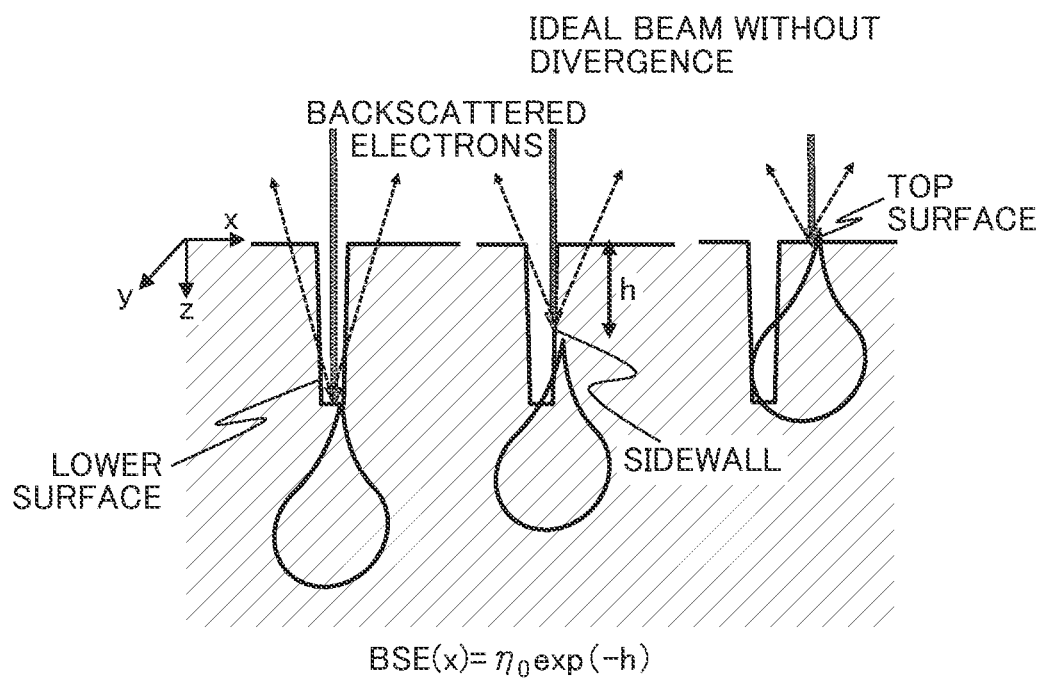
FIG. 2 is a cross-sectional view illustrating a behavior of BSE generated when a primary electron beam without convergence angle is emitted.

With reference to FIG. 2, a principle for measuring the three-dimensional shape of this embodiment will be described. Typically, when a sample is irradiated with an electron beam having an energy, secondary electrons and/or backscattered electrons having different energies are generated by an interaction between the electrons entering the sample and a substance. A generation amount of the backscattered electrons largely depends on an incidence angle of the electron beam and an average atomic number of the substance.

For example, when, in a hole and/or a trench with a high aspect ratio formed in a uniform (identical or close in average atomic number) material, a bottom surface is irradiated with a primary electron beam having a high energy and observed, a volume of the hole/the trench as a cavity is considerably small compared with a scattering region of the backscattered electrons, and therefore, an effect on a scattering trajectory of the backscattered electrons is extremely small. Therefore, it can be regarded that an amount of BSE signal passing through the sidewall and scattered throughout the surface depends on an average movement distance from an incident position of the primary electron beam to the surface. As the incident position of the primary electron beam is deep, a distance to the surface gets long and an energy loss gets large by scattering; therefore, the amount of BSE signal scattering through the sample decreases. This ensures estimating a depth of the bottom surface from a degree of the decreased amount of BSE signal of the bottom surface.

Furthermore, in this embodiment, it is found that a height of an irradiation position on the side surface can be estimated from the amount of BSE signal even on the sidewall of the hole as an inclined surface. The reason is that the trajectory of the primary electron beam in high acceleration within the sample can ignore a dependence property with respect to the incidence angle when the incidence angle into the side surface is small. Accordingly, it is possible to calculate the three-dimensional shape (or depth information) of the sidewall based on a difference between heights of a top surface and a bottom surface by comparing backscattered electron signal intensities from the top surface, the bottom surface, and the sidewall of the pattern. A relational expression or a data table can include information on a relationship between the amount of BSE signal and the height.

As illustrated in FIG. 2, in this embodiment, when an ideal primary electron beam without convergence scans the hole, an amount of BSE signal at any incident position is set as a function of only a depth H with respect to the top surface (H=0) of the hole (Formula 1).

Amount of BSE signal=$\eta \cdot e^{-H}$      (Formula 1)

The coefficient $\eta$ is a coefficient relating to an average atomic number, a density of a peripheral structure, a count of incident electrons, and an accelerating voltage of the material.

From this, based on a difference between the top surface BSE signal and the bottom surface BSE signal and a difference between heights of the top surface and the bottom surface, a relationship between a BSE relative signal intensity at any incident position and a relative depth (Formula 2) can be obtained.

BSE relative signal intensity=$(e^{-h}-e^{-1})/(e^{0}-e^{-1})$ $h=[0,1]$      (Formula 2)

In Formula 2, the signal intensity of the top surface is set to 1, a signal intensity of the bottom surface is set to 0, a depth of the top surface is set to 0, a depth from the top surface to the bottom surface is set to H, and a relative depth of an intermediate position where the beam hits is set to h.

Verification results after performing electron beam simulations (Monte Carlo Simulation) are illustrated. These are results obtained by changing opening densities, taper angles, and depths of holes or trenches as measurement-target, irradiating from top surfaces to bottom surfaces with electrons (beam without divergence) having an energy of 30 kV, and standardizing detected BSE signals with respect to BSE signals at the top surfaces.

Figure 3A:
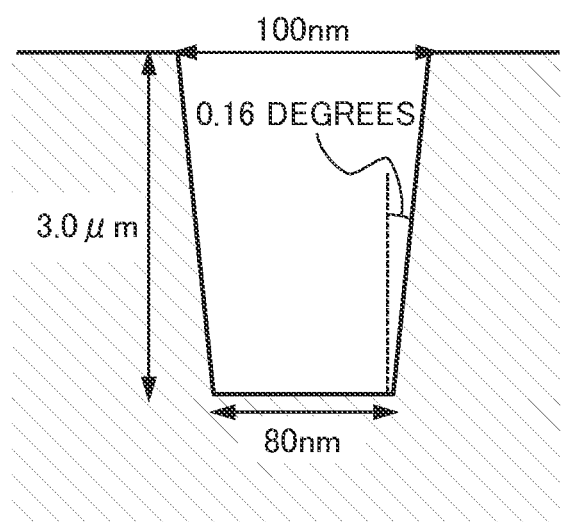
FIG. 3A is a drawing describing a sample in which a hole pattern formed with a top diameter and a bottom diameter with identical depths and different opening densities is formed.

In the case of FIG. 3A, a cross-sectional shape of a hole has a top dimension: 100 nm, a bottom dimension: 80 nm, a hole depth: 3.0 µm, and opening densities of a hole pattern: 15%, 30%, and 45%.

Figure 4A:
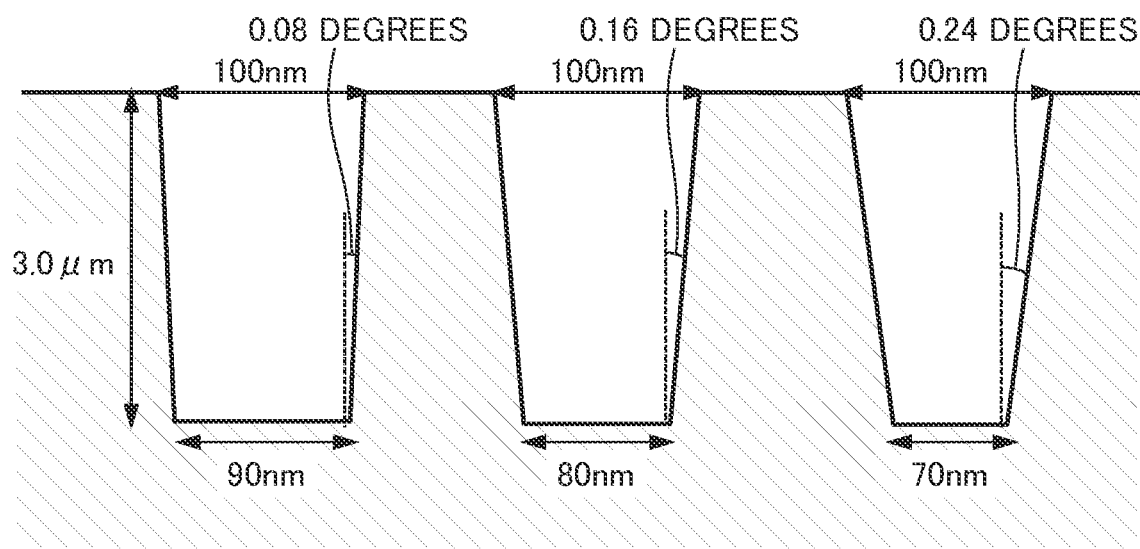
FIG. 4A is a drawing describing a sample in which a hole pattern formed with different taper angles is formed.

In the case of FIG. 4A, cross-sectional shapes of holes have top dimensions: 100 nm, bottom dimensions: 90 nm, 80 nm, and 70 nm, hole depths: 3.0 µm, and an opening density of a hole pattern: 30%. Respective taper angles are 0.08 degrees, 0.16 degrees, and 0.24 degrees.

Figure 5A:
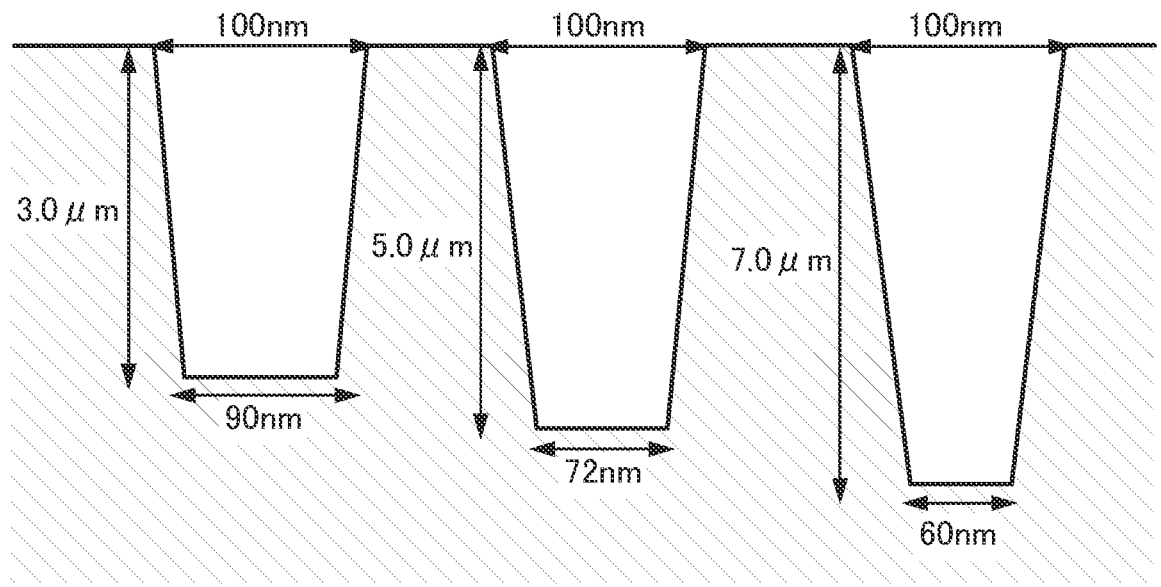
FIG. 5A is a drawing describing a sample in which a hole pattern formed with different depths is formed.

In the case of FIG. 5A, cross-sectional shapes of holes have top dimensions: 100 nm, bottom dimensions: 80 nm, 72 nm, and 60 nm, hole depths: 3.0 µm, 5.0 µm, and 7.0 µm, and an opening density of a hole pattern: 30%. All taper angles are 0.16 degrees.

Figure 3B:
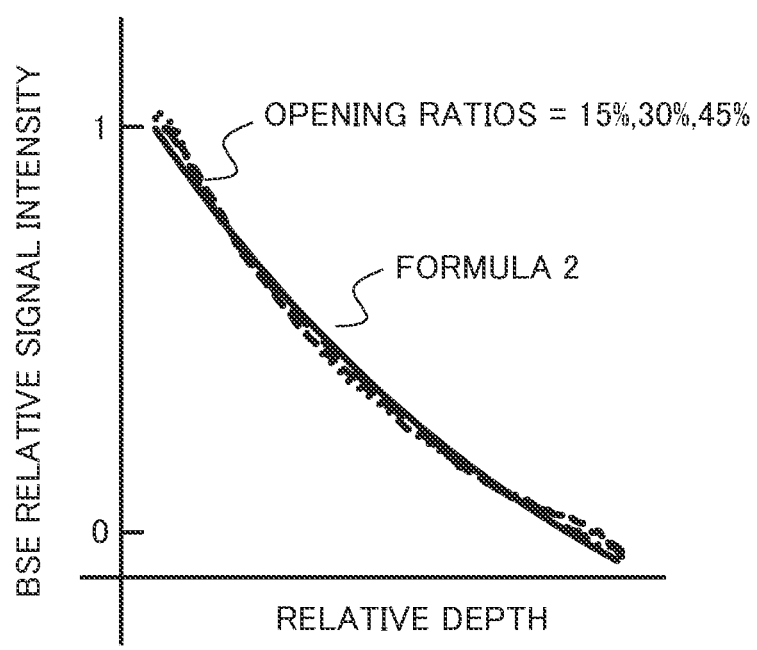
FIG. 3B is a graph illustrating a result of simulating a relationship between a signal intensity of backscattered electrons (BSE) and a depth detected when the sample in which the hole pattern formed with the top diameter and the bottom diameter with identical depths and the different opening densities is formed is irradiated with a primary electron beam.
Figure 4B:
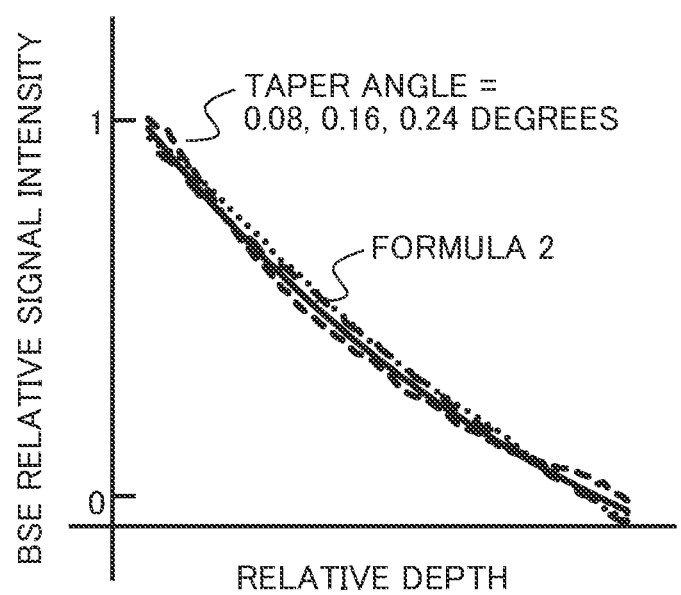
FIG. 4B is a graph illustrating a result of simulated relationship between a signal intensity of backscattered electrons (BSE) and a depth detected when the sample in which the hole pattern formed with the different taper angles is formed is irradiated with the primary electron beam.
Figure 5B:
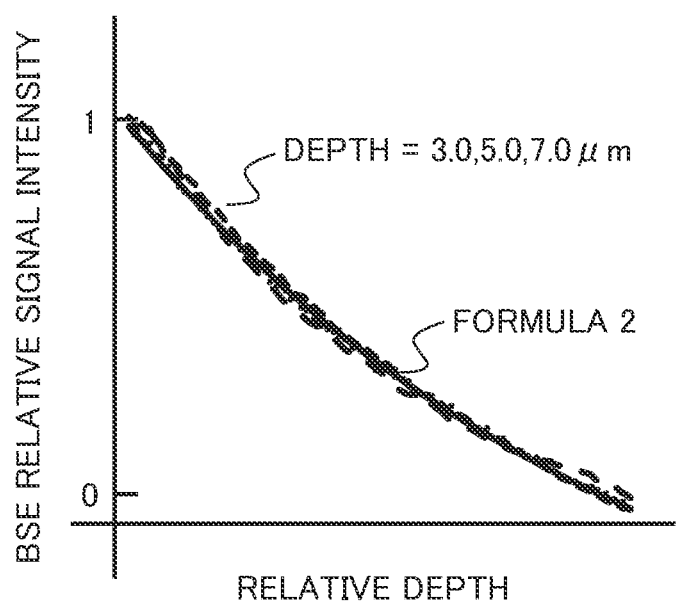
FIG. 5B is a graph illustrating a result of simulating a relationship between a signal intensity of backscattered electrons (BSE) and a depth detected when the sample in which the hole pattern formed with the different depths is formed is irradiated with the primary electron beam.

As illustrated as simulation results in FIG. 3B, FIG. 4B, and FIG. 5B, it can be seen that the BSE relative signal intensity does not depend on the opening density of the hole (FIG. 3B), the taper angle of the hole (FIG. 4B), and the depth (FIG. 5B). Accordingly, the BSE relative signal intensity depends only on the function $e^{-h}$ of the relative depth of the incident position of the beam without divergence. That is, using (Formula 2) ensures measuring an intermediate depth from a relative intensity of the BSE signal irrespective of opening density, observation condition, and the like of a material of the sample and/or the peripheral structure. Then, continuously measuring dimensions in a horizontal direction in the middles of the hole in the intermediate depths ensures measuring a continuous three-dimensional shape in a depth direction. While a smoother measurement can be performed as measurement points increase, the measurement points may be covered by estimating with a function or the like. The relationship between the relative signal intensity and the relative depth may be calculated by (Formula 2), or a preliminarily calculated result may be stored in a database.

Beam without Convergence Angle

Figure 6A:
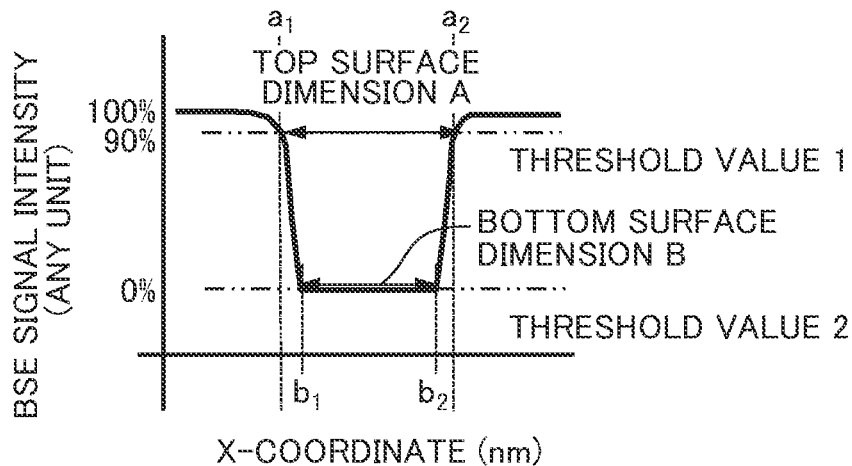
FIG. 6A is a drawing illustrating a measuring method for a relative cross-sectional shape (top surface and bottom surface) of a deep hole or a deep trench based on a relationship between a relative signal intensity and a relative depth.
Figure 6B:
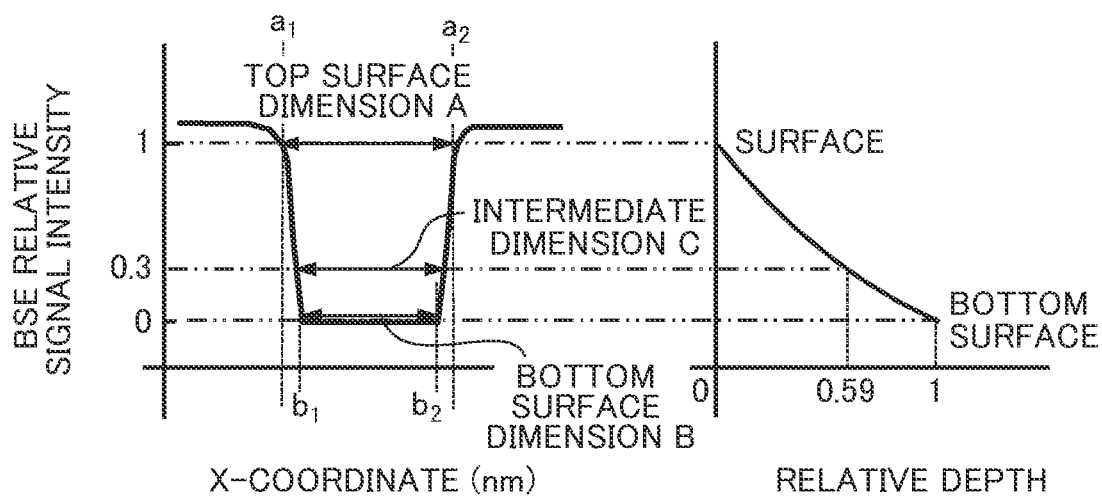
FIG. 6B is a drawing illustrating a measuring method for a relative cross-sectional shape (intermediate dimension) of the deep hole or the deep trench based on the relationship between the relative signal intensity and the relative depth.
Figure 6C:
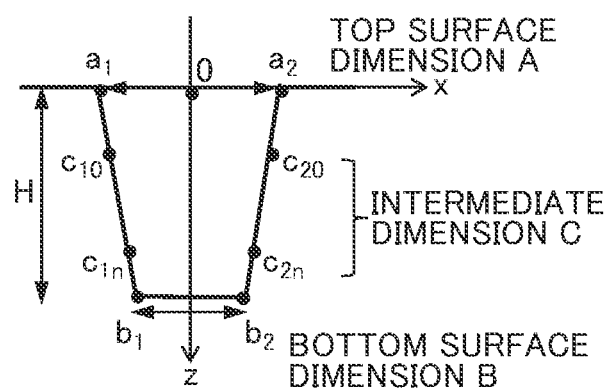
FIG. 6C is a drawing illustrating a measuring method for a relative cross-sectional shape (plurality of intermediate dimensions) of the deep hole or the deep trench based on the relationship between the relative signal intensity and the relative depth.

FIGS. 6A to 6C are drawings illustrating a method for calculating a relative cross-sectional shape of a deep hole, a deep trench, or the like based on the relationship between the relative signal intensity and the relative depth h. In this embodiment, the shape of the pattern is measured based on threshold value settings in the signal intensity. That is, distances between intersection points between the threshold values and a signal profile are associated to be output as dimension values of a pattern cross-sectional shape.

First, as illustrated in FIG. 6A, in order to measure a dimension A and a dimension B of a top surface and a bottom surface, respectively, of a hole, setting a threshold value 1 based on a BSE image ensures calculating a difference between intersection points $a_1$ and $a_2$ in x-coordinate as the top surface dimension A. Next, as illustrated in FIG. 6B, the relative signal intensity of $a_1$ and $a_2$, which is a position of the top surface, is set to 1.

Then, a threshold value 2 is set by a procedure similar to the setting of the threshold value 1. That is, calculating a difference between intersection points $b_1$ and $b_2$ in the coordinate as the bottom surface dimension B and setting a relative signal intensity of $b_1$ and $b_2$, a position of the bottom surface, to 0 standardize the signal intensity to be relative. For example, the threshold value 1 is preferred to be high within a range where a noise of the signal does not bury the threshold value 1, and the threshold value 2 is also preferred to be low within a range where the noise does not bury the threshold value 2. Specifically, the threshold value 1 is set to 90% of a whole height of the signal profile and the threshold value 2 is set to 0%. While the example where the top surface and the bottom surface are preferably determined has been described, the setting of the threshold values may be set to another value.

As a result, FIG. 6B illustrates the BSE relative signal intensity with the signal intensity at the top surface position being set to 1 and the signal intensity at the bottom surface position being set to 0. The BSE relative signal intensity is a function of a relative depth of the hole; therefore, continuously obtaining relative depths and dimensions positioned at the depths indifferent threshold values using relationship information of (Formula 2) ensures calculating the relative cross-sectional shape.

Finally, FIG. 6C illustrates an example of establishing the cross-sectional shape based on the obtained relative cross-sectional shape (set of relative intermediate height and intermediate dimension value positioned at the depth) and an absolute depth (Z-axis direction). With a center position of the top surface of the hole being set as an origin 0 of the coordinate, the obtained absolute depth H is disposed in the Z-axis direction. Based on the top surface of the hole, the absolute depth is calculated from a relative intermediate height. Then, in order to obtain a dimension value positioned at the depth, from $c_{10}$ and $c_{20}$ to $c_{1n}$ and $c_{2n}$ are disposed equally to the right and the left with respect to the Z-axis and in order to obtain the bottom surface dimension, $b_1$ and $b_2$ are disposed equally to the right and the left with respect to the Z-axis. A multipoint approximate shape obtained by connecting the disposed points is a shape measured from the incidence angle.

Measurement of Absolute Depth (H) in Consideration of Displacement Between Top Surface and Bottom Surface As means for obtaining the absolute depth (H) of the deep hole/the deep trench, this embodiment calculates the absolute depth (H) using relationship information on a displacement between the top surface and the bottom surface of the deep hole/the deep trench at the incidence angle.

Specifically, a plurality of relative incidence angles of the beam to the sample are set. The incidence angle (γ degrees) is changed within a range where a whole bottom surface can be observed so as to scan and form images. Based on a plurality of the obtained images, a displaced amount between the top and the bottom is measured. The displaced amount between the top and the bottom and an inclination of the incidence angle line provide a depth of the hole. (Formula 3) ensures obtaining the depth of the hole.

Displaced amount between top and bottom=depth×tan(γ/180*π)≈depth×(γ/180*π)   (Formula 3)

When the incidence angle γ is small, tan γ is approximated as γ.

Figure 7A:
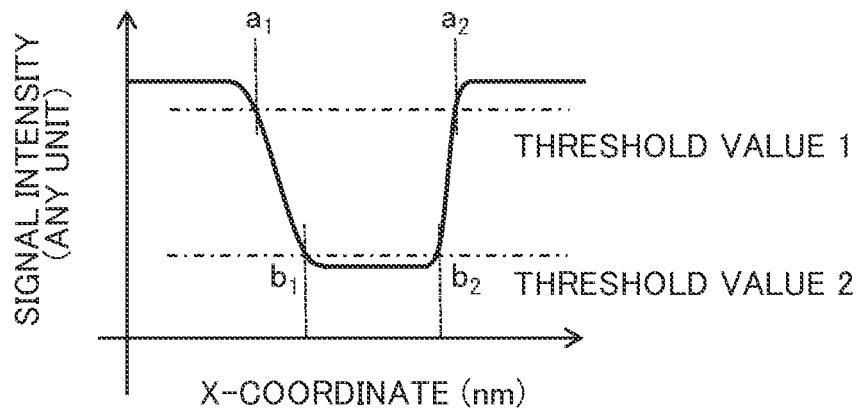
FIG. 7A is a drawing illustrating a method for measuring an absolute depth of the deep hole or the deep trench from a relationship between an incidence angle and a displaced amount between a top and a bottom.
Figure 7B:
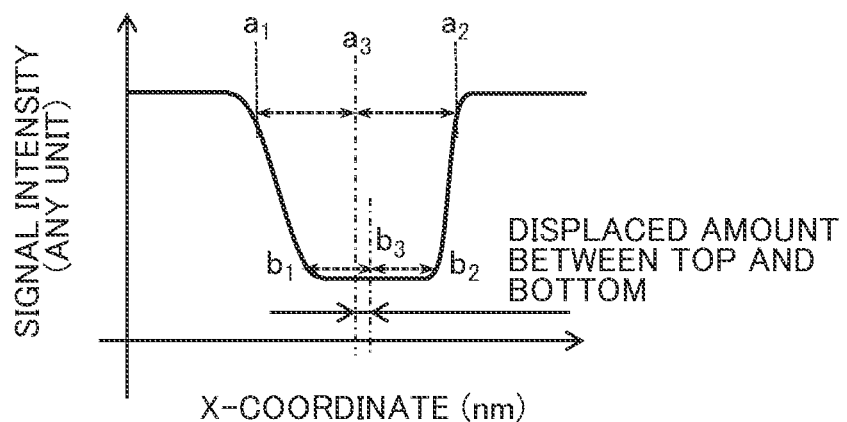
FIG. 7B is a drawing illustrating the method for measuring the absolute depth of the deep hole or the deep trench from the relationship between the incidence angle and the displaced amount between the top and the bottom.

As illustrated in FIG. 7A and FIG. 7B, in this embodiment, centers between the intersection points between the set threshold values and the signal profile are output as centers of the hole. FIG. 7B illustrates an example of calculating a center $a_3$ of the top surface and a center $b_3$ of the bottom surface. As described in FIG. 6A, setting the threshold value 1 and the threshold value 2, which are different, using the profile of the BSE image ensures calculating intersection points $a_1$ and $a_2$, and $b_1$ and $b_2$. Then, $(a_1+a_2)/2$ and $(b_1+b_2)/2$ are obtained as the centers $a_3$ and $b_3$ of the top surface and the bottom surface. That is, a center position between $a_1$ and $a_2$ is $a_3$, and a center position between intersection points $b_1$ and $b_2$ is $b_3$. The threshold value 1 is preferred to be high within a range where the noise of the signal does not bury the threshold value 1, and the threshold value 2 is also set to be low within a range where the noise does not bury the threshold value 2. From coordinate values of $a_3$ and $b_3$, respective displaced amounts between the top and the bottom can be calculated at different incidence angles.

Figure 7C:
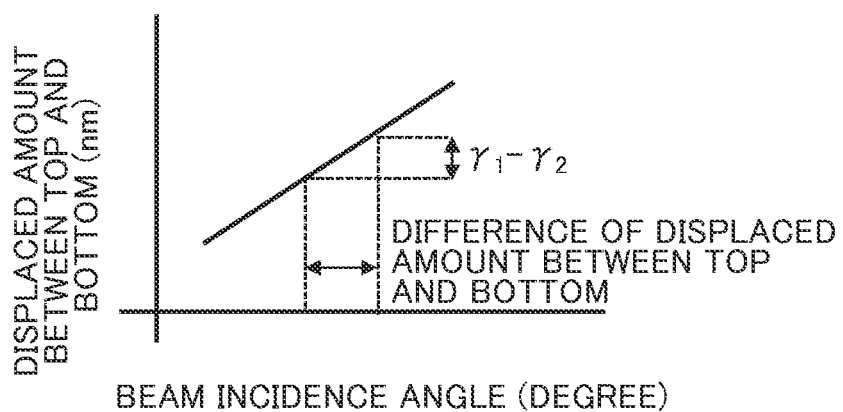
FIG. 7C is a drawing illustrating the method for measuring the absolute depth of the deep hole or the deep trench from the relationship between the incidence angle and the displaced amount between the top and the bottom.

FIG. 7C is a drawing illustrating an exemplary graph that plots displaced amounts between the top and the bottom when the incidence angle is changed by every 0.01 degrees within a range where the bottom portion of the hole is visible. The displaced amount between the top and the bottom and an inclination of the incidence angle line provide a depth of the hole.

Depth=difference of displaced amount between top and bottom/$((\gamma_1-\gamma_2)/180*\pi)$   (Formula 4)

Alternatively, forming an image by changing two incidence angles using (Formula 4) also ensures obtaining the depth from a difference of the displaced amount between the top and the bottom and a difference between the incidence angles based on the obtained image.

The cross-sectional shape or a three-dimensional shape established by the calculation unit 17 in FIG. 1 can be displayed on the display device 19. The display device 19 includes a GUI that displays the three-dimensional shape of the target pattern for a user. In the three-dimensional shape, feature quantities, such as an inclination angle, a taper angle, a depth of bowing, and a bowing dimension value of the sidewall of the deep hole or the deep trench, can be displayed. Second Embodiment Beam with Convergence Angle In the scanning electron microscope, the electrons extracted from an electron source are narrowed down to a focal position by an effect of a lens. However, for example, excitation effects of an electromagnetic lens differ with differences in energies of individual electrons, and thus, the electron beam has a property of having a convergence to some extent with respect to the focal position.

The inventors have focused on this respect to find out that accuracies of setting angles of the sample and the beam largely affect on accuracies of obtained cross-sectional shape and reconfigured three-dimensional shape. Accordingly, calibrating the incidence angle with high accuracy ensures significantly improved accuracy in the obtained cross-sectional shape and the reconfigured three-dimensional shape.

Figure 8A:
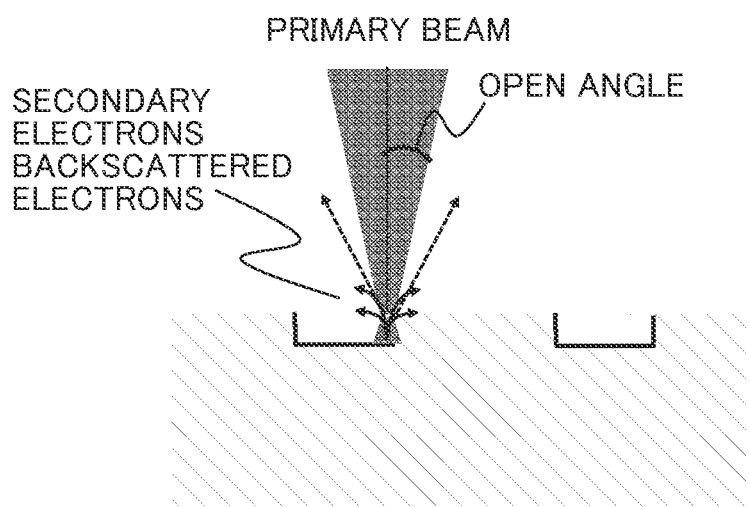
FIG. 8A is a cross-sectional view illustrating a behavior of BSE generated when a primary electron beam with divergence is emitted.

As illustrated in FIG. 8A, the electron beam forms a focal point with a limited convergence angle; therefore, in the case where the focal position is displaced in a depth direction, the electron beam immediately diverges depending on a size of the convergence angle.

However, as illustrated in FIG. 8A, when a dimension of a shallow pattern is measured, the primary electron beam converges on a surface of the pattern, and therefore, the divergence (intensity distribution) of the beam at a position away from the focusing point position has a small effect on measurement accuracy.

Figure 8B:
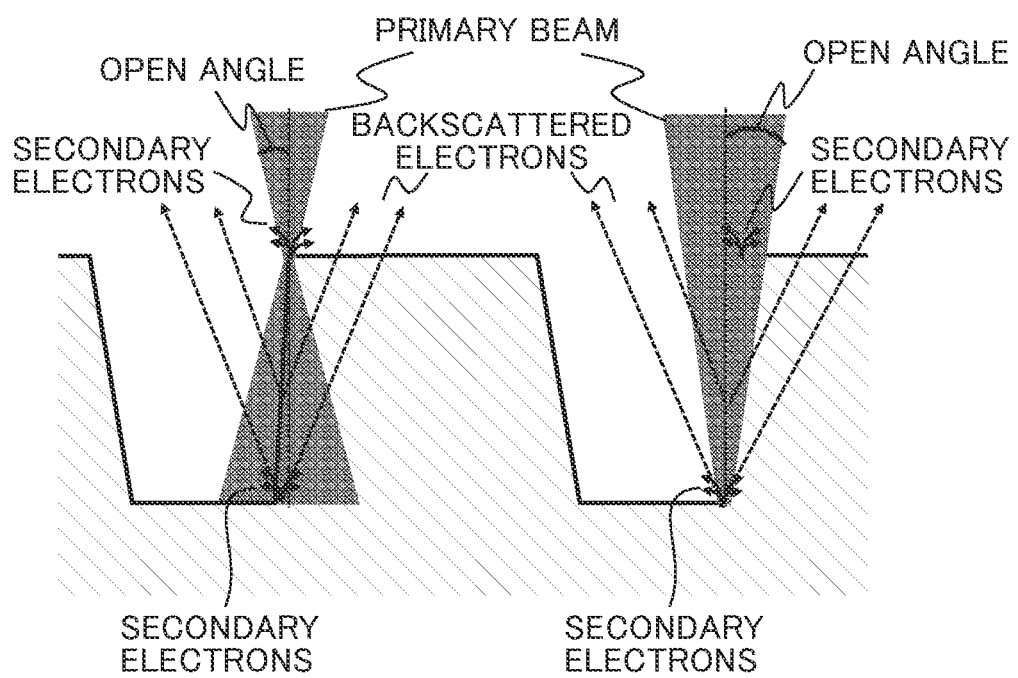
FIG. 8B is a cross-sectional view illustrating a behavior of the BSE generated when the primary electron beam with divergence is emitted.

Meanwhile, as illustrated in FIG. 8B, when a deep hole and/or deep trench pattern is measured, the intensity distribution of the primary beam within a height range between the top surface and the bottom surface of the pattern largely affects on the BSE signal. Even though a focus position is changed, an irradiation condition of the top surface, the bottom surface, or the sidewall of the hole differs depending on a scan position, and thus, the BSE signals emitted from various depth positions are detected without being distinguished. Even in an identical wafer, the shapes of the formed holes are not always identical. Depending on formation accuracy (such as taper angle of sidewall) of the hole/the trench as the measurement-target, the electron beam with convergence has an irradiated region changed when reaching the hole/the trench, and thus, the BSE signal intensity changes. In view of this, the shape measurement accuracy is largely affected.

Accordingly, the primary electron beam has the intensity distribution changed by the convergence angle and a distance away from the focal position. In this embodiment, this intensity distribution depending on the height is taken into consideration. As described above, the amount of BSE signal at any incident position of the hole relates to the depth H of the position and the count of incident electrons. In view of this, when the primary electron beam with convergence scans the deep hole and/or trench, the amount of BSE signal at arbitrary scan position ($x_0$) becomes an integrate of a multiplication of an amount of BSE relative signal depending on the primary electron beam intensities at respective incident positions in the divergence and the depths of the positions in the irradiated region of the deep hole and/or trench. The intensity distribution depending on the height of the primary electron beam is set to G (x, f(x)), and the relative depth h of the incident position is set to f(x).

$$BSE(x_0) = \eta \int G(x-x_0, f(x)) \exp(-f(x)) dx \quad \text{(Formula 5)}$$

(Formula 5) is a formula to calculate the BSE signal.

The following describes a method for estimating a three-dimensional shape of the deep hole and/or trench based on the intensity distribution of the primary electron beam with the open angle using relationship information showing the relationship between the relative intensity of the BSE signal and the depth. First, information relating to the intensity distribution depending on the height of the primary electron beam is preliminarily obtained corresponding to an optical condition of an electron microscope. A method for obtaining primary electron beam intensity distribution data may use design data and a relational expression of electron optics. The intensity distribution estimated from a change in a resolution of an SEM image by changing focus positions may be used. Preliminarily compiled database of the intensity distribution of the primary electron beam is stored in the calculation unit.

Figure 9:
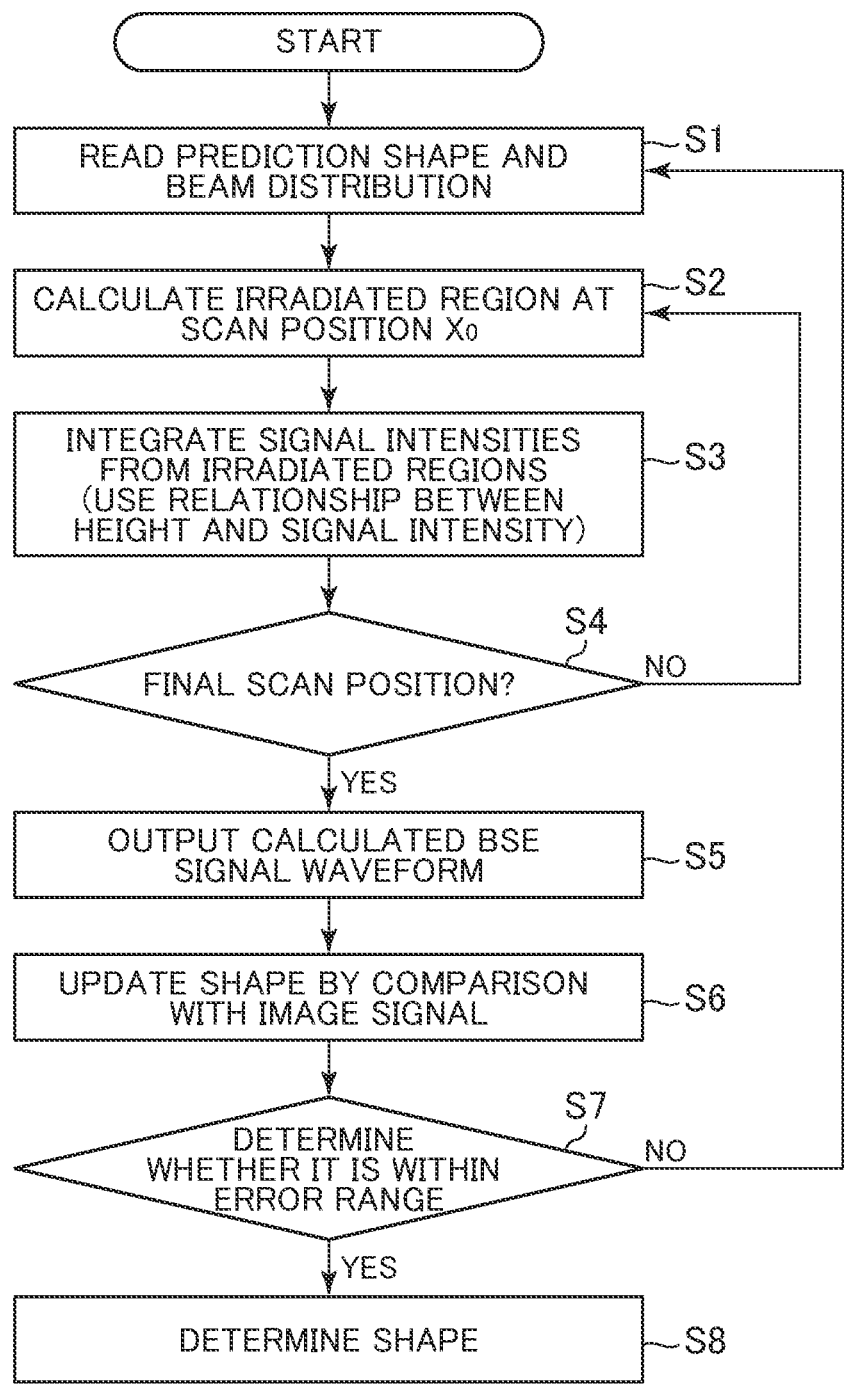
FIG. 9 is a drawing illustrating a process to calculate a relative cross-sectional shape based on an intensity distribution depending on a height of the primary electron beam.

FIG. 9 is a process to calculate a relative cross-sectional shape of one azimuth of a deep hole pattern or a deep trench pattern. Optical conditions and imaging conditions are set with the measuring system of the scanning electron microscope. Next, a BSE image is obtained based on the set conditions, and a BSE profile of the beam with divergence obtained from the SEM image is input to the calculation unit 17. In the calculation unit 17, the input BSE profile of the SEM image and the relationship information of (Formula 2) are used to measure intermediate depths and dimension values positioned at the respective depths with respect to the top surface to predict the shape (Step S1). Next, intensity distribution data of the primary electron beam under the set optical conditions is read, and irradiated regions of the hole are calculated at respective scan positions based on intensity distribution information on the primary electron beam (Step S2).

Next, (Formula 5) integrates amounts of BSE signal of the respective incident positions in the irradiated region (Step S3), and calculates the BSE signals of all the scan positions (Step S5). The calculated BSE profile and the BSE profile of the SEM image are compared, and then, an estimated shape of the hole is corrected with the difference (Step S6). The BSE profile in a shape corrected based on the intensity distribution of the primary electron beam is calculated, and the above-mentioned correction is performed until the difference in the comparison with the BSE profile of the SEM image becomes an acceptable value (Step S7). The shape when the difference in the comparison becomes the acceptable value is output as a final shape, and the calculation of the relative cross-sectional shape is terminated (Step S8).

When the calculation of the BSE profile is started, the cross-sectional shape of the sidewall estimated by shape information of design and other means may be used, besides the prediction of the shape using the relationship information of Formula 2.

A mathematical method is used when the shape is corrected from the difference between the calculated BSE profile and the BSE profile of the SEM image as a supplement. For the BSE signal intensities of the respective scan positions, the shape is updated by a calculation, such as the least-square method and the minimum divergence method, between the calculated BSE profile and the BSE profile of the SEM image, and the correction is executed while limitations for the estimated shape are applied.

Figure 10A:
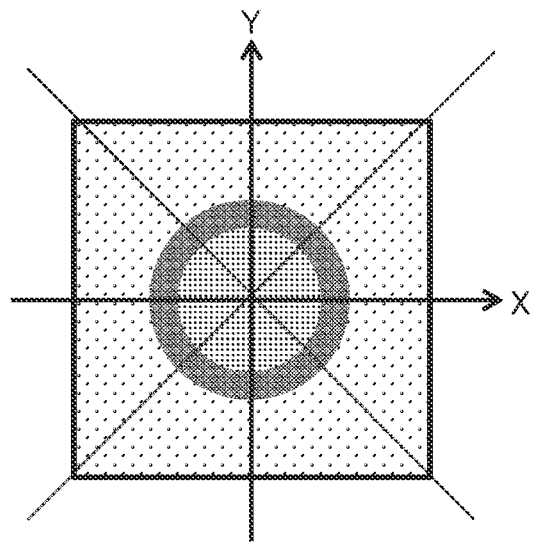
FIG. 10A is a drawing illustrating a measurement from different azimuths upon establishing a three-dimensional shape.
Figure 10B:
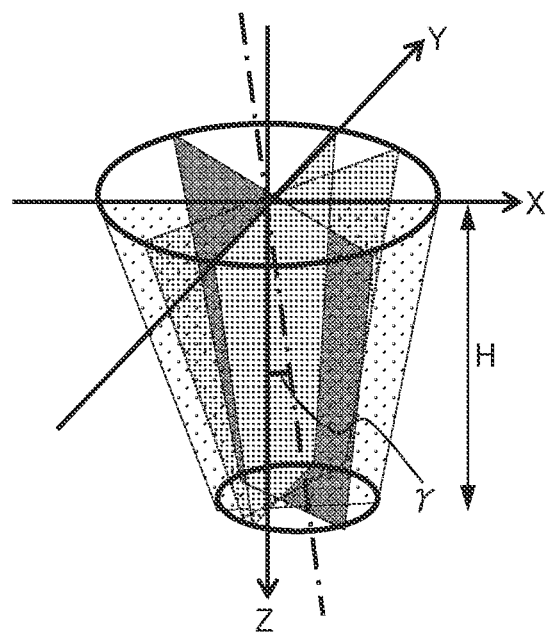
FIG. 10B is a drawing illustrating the establishment of the three-dimensional shape by the measurement from the different azimuths.

Next, as illustrated in FIG. 10A, when a three-dimensional shape is measured, for example, the above-described calculation of the BSE signal is repeated for each of directions of the cross-sectional surfaces of four azimuth angles. As illustrated in FIG. 10B, then, a three-dimensional shape can be established based on a plurality of azimuths of the cross-sectional shapes and the depth information obtained in the calculation unit 17.

Figure 11:
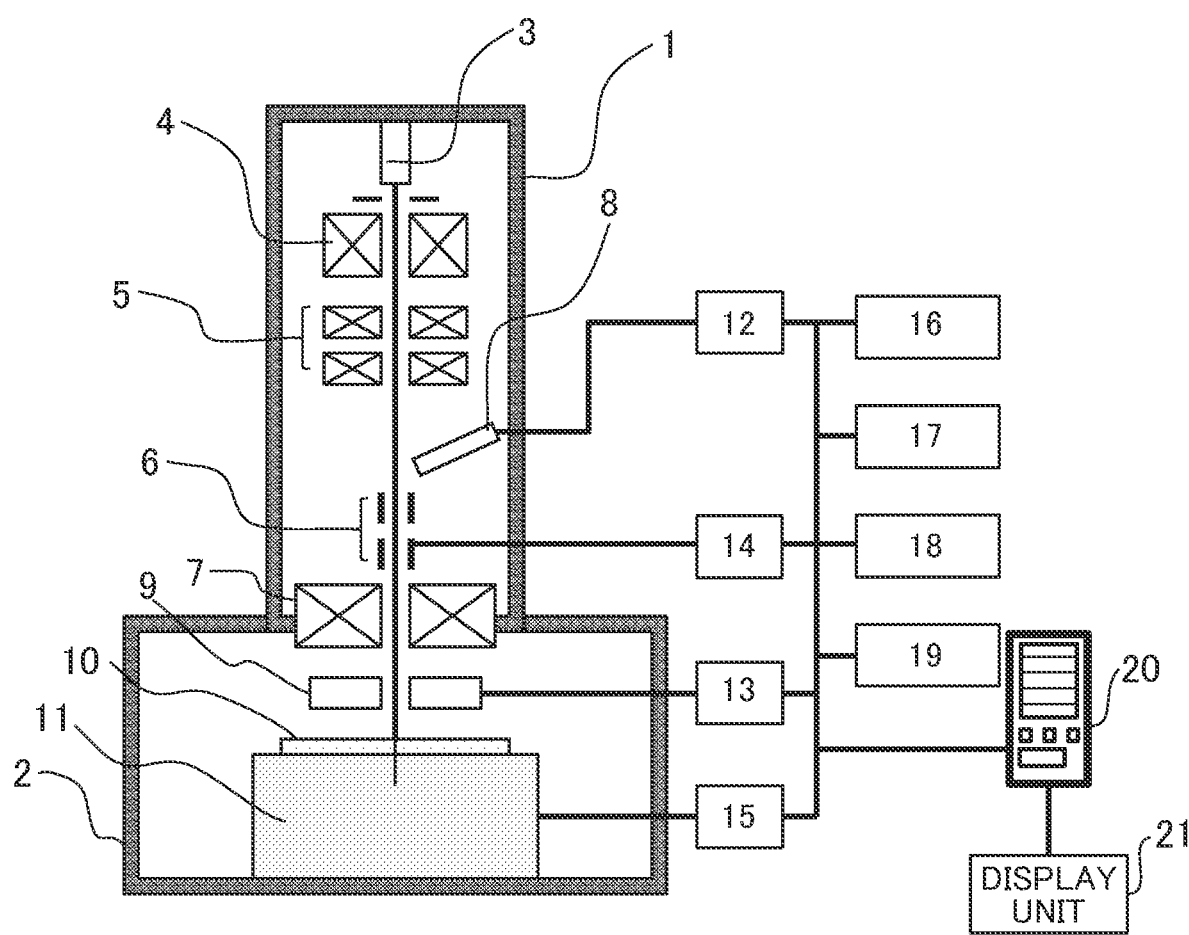
FIG. 11 is a block diagram illustrating a measuring device and a measuring system for a three-dimensional shape by a scanning electron microscope according to the present invention.

As illustrated in FIG. 11, establishing the three-dimensional shape requires a high processing capability of a calculator, and therefore, a server for calculation 20 may be disposed outside the device main body. In view of this, a quick establishment of the three-dimensional shape is ensured after the image is obtained. An efficient operation is ensured also by forming images with a plurality of electron microscopes using the network. As a function, the server for calculation 20 stores an intensity distribution database of the primary electron beam having an open angle for each optical condition. The server for calculation 20 calculates the BSE signal based on the intensity distribution of the primary electron beam, compares the BSE signal with the BSE signal of an observation image of a target pattern obtained by scanning of the electron microscope, and calculates the relative cross-sectional shape. The cross-sectional shape is established based on the obtained relative cross-sectional shape and the absolute depth. Corresponding to the incidence angles, the calculated cross-sectional shapes are associated, and a plurality of the cross-sectional shapes are aggregated to establish the three-dimensional shape. Disposing a plurality of the display devices, for controlling device and for displaying calculation data, ensures performing a shape analysis without interfering with image obtainment. A display unit 21 includes a GUI that displays a shape for the user. The calculated cross-sectional shape or three-dimensional shape is displayed on the display unit 21. In the three-dimensional shape, feature quantities, such as an inclination angle, a taper angle, an intermediate depth, and a dimension value positioned at the depth of the sidewall of the deep hole or the deep trench, can be displayed.

Figure 12:
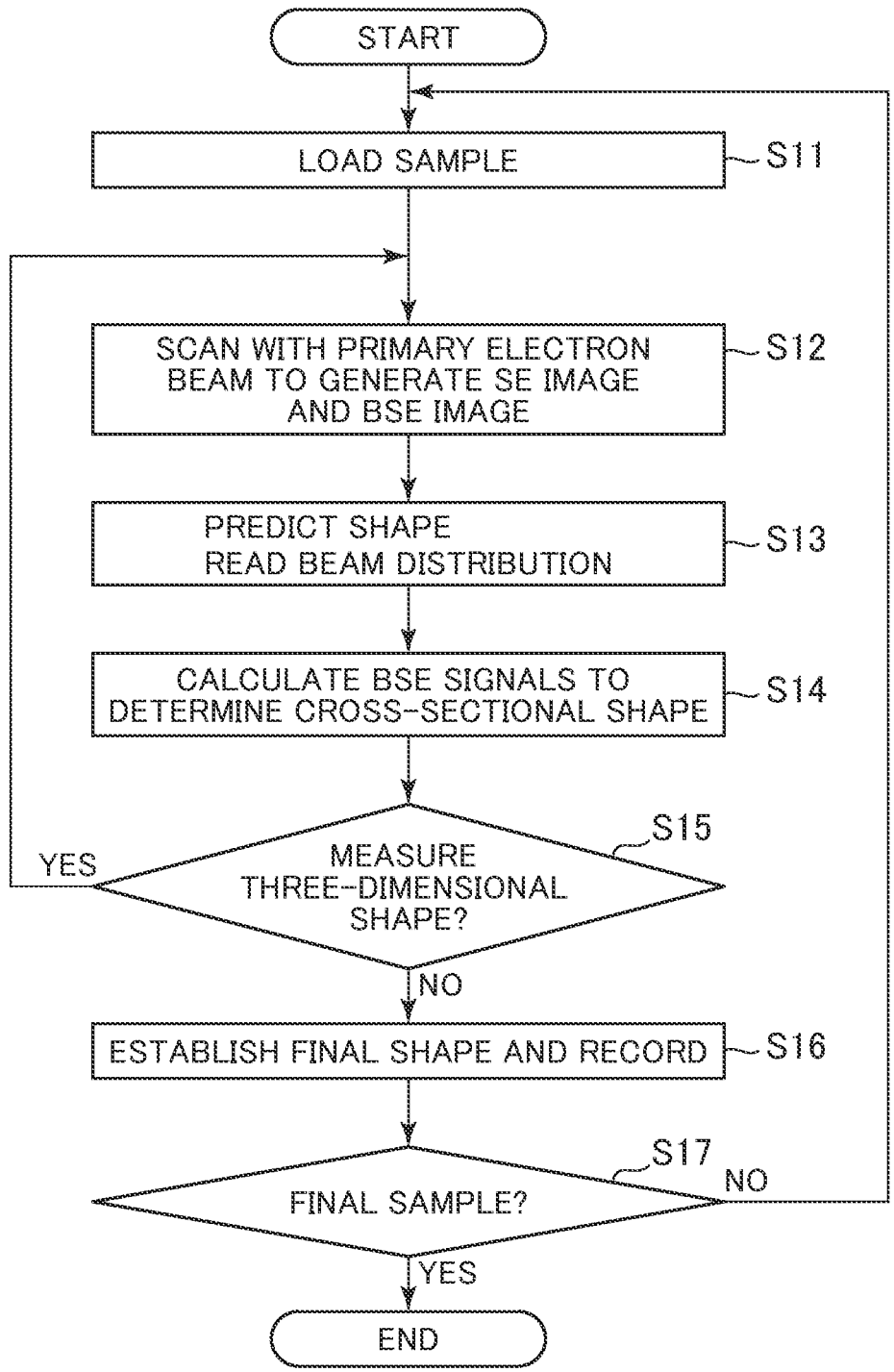
FIG. 12 is a drawing illustrating a measurement sequence of a three-dimensional shape of a pattern.

FIG. 12 describes a sequence for measuring a three-dimensional shape of a pattern using a scanning electron microscope including a BSE signal arithmetic device. First, a wafer on which a pattern as measurement-target is formed is introduced into a vacuum sample chamber of the SEM (Step S11), and the pattern as the measurement-target is subjected to a primary electron beam scanning. An SE signal and a BSE signal that can be obtained are detected to generate an image of the signals having a convergence angle (Step S12). A BSE profile of a beam with convergence obtained from the SEM image is obtained. A shape of the pattern is predicted from the obtained SEM image (Step S13). Based on intensity distribution information (convergence angle) of the primary electron beam, a calculation of the above-described BSE signal is performed, and a shape correction is performed until a difference in a comparison with the BSE profile of the SEM image becomes an acceptable value (Step S14). Next, a determination is made whether the three-dimensional shape is measured (Step S15). When the three-dimensional shape is measured, the process returns to Step S12, and then, two-dimensional scanning is performed on an identical position at a plurality of azimuths. When the measurement of the three-dimensional shape is not performed any more, the measured final shape described above is output (Step S16). Then, a determination is made whether it is the final sample (Step S17), and when it is not the final sample, the process returns to Step S11 to start measuring the next sample. When it is the final sample at Step S17, the measurement is terminated.

Third Embodiment

Example of Hole with Tapered Sidewall

While in the second embodiment, the example of the perpendicular hole pattern with taper has been described, changing an incidence angle of the primary electron beam ensures similarly measuring a three-dimensional shape of an inclined hole pattern.

Figure 13A:
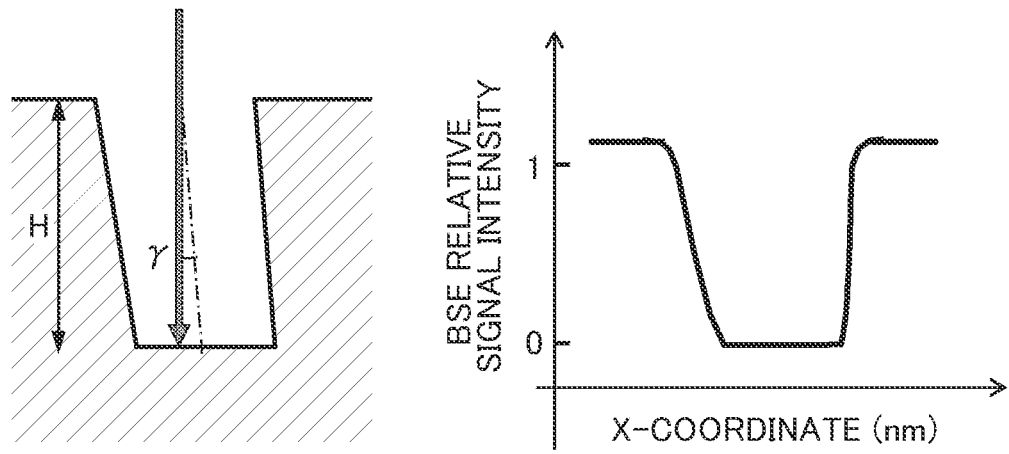
FIG. 13A is a drawing measuring a cross-sectional shape of an inclined hole.

As illustrated in a drawing on a left side in FIG. 13A, in the case of an inclined hole or trench pattern, a BSE signal profile when the primary electron beam vertically enters is measured as illustrated in a drawing on a right side in FIG. 13A. That is, although a right side of the deep hole/the deep trench being inclined, the primary electron beam only enters vertically, and thus, this portion is not accurately measured. That is, information on an inclination with which a top surface side blocks a bottom surface is hard to measure with the vertical primary electron beam. Accordingly, when the BSE profile is asymmetric, it can be found that the pattern is possibly inclined.

Figure 13B:
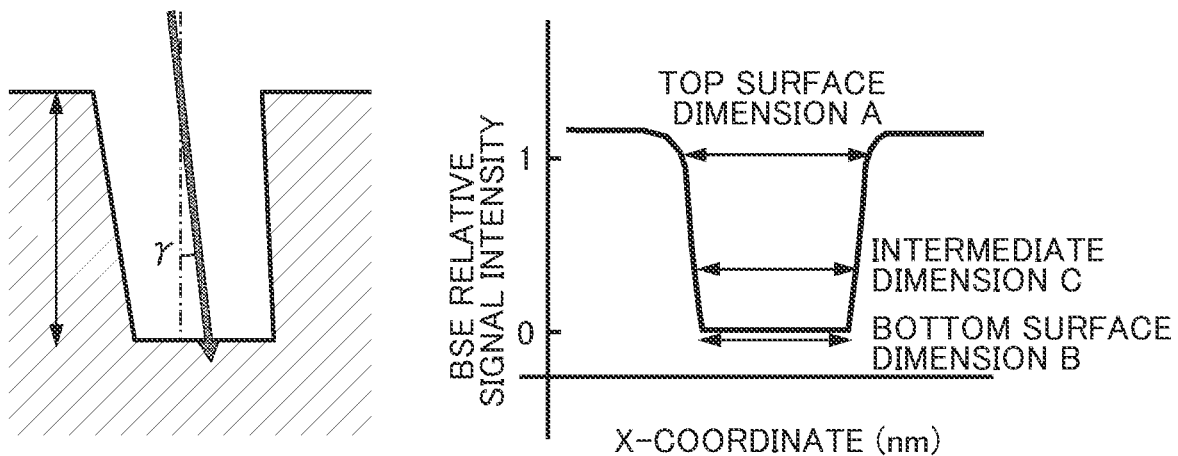
FIG. 13B is a drawing measuring the cross-sectional shape of the inclined hole.

In this case, an incidence angle is changed as illustrated in a drawing on a left side in FIG. 13B to search for an incidence angle at which the BSE profile becomes symmetric. The incidence angle at this time is identical to an inclination angle of the hole. As illustrated in a drawing on a right side in FIG. 13B, intermediate depths and dimension values positioned at the respective depths are measured using the symmetric BSE profile and the relationship information of (Formula 2), and thus, the shape can be predicted. Corresponding to relative incidence angles between the sample and the electron beam, irradiated regions of the hole are calculated at respective scan positions. Based on an intensity distribution of the primary electron beam having the open angle, a calculation of the BSE signal is performed similarly as described above, and a shape correction is performed until a difference in a comparison with the BSE profile of the SEM image becomes an acceptable value. This ensures establishing the cross-sectional shape based on the relative cross-sectional shape (relative intermediate height and intermediate dimension value positioned at the depth) obtained by the calculation of the measured BSE signal and the absolute depth.

Figure 13C:
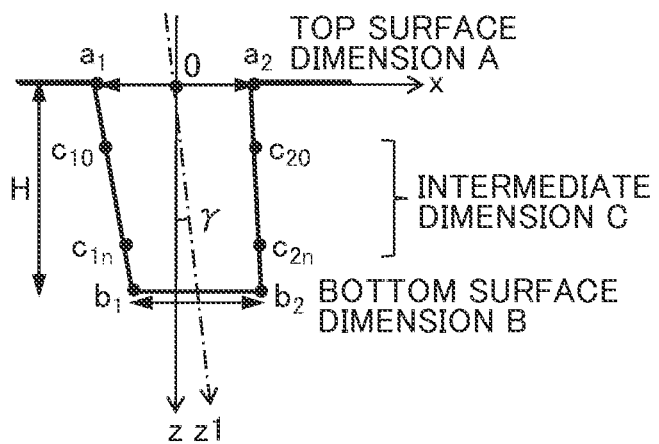
FIG. 13C is a drawing measuring the cross-sectional shape of the inclined hole.

FIG. 13C is an example of establishing a shape of a cross-sectional observed from a direction in which an incidence angle is at γ degrees with respect to the deep hole (relative angle of electron beam is γ degrees with respect to Z-direction). With a center position of a top surface of the hole being set as an origin 0 of the coordinate, the obtained absolute depth H is disposed in the Z-axis direction. Then, a Z1-axis is disposed so as to have the incidence angle γ with respect to the Z-axis (incidence angle at which displaced amount between top and bottom of hole becomes 0). Then, based on the top surface of the hole, the absolute depth is calculated from the relative intermediate height. In order to obtain a dimension value positioned at the depth, from $c_{10}$ and $c_{20}$ to $c_{1n}$ and $c_{2n}$ are disposed equally to the right and the left with respect to the Z1-axis and in order to obtain the bottom surface dimension, $b_1$ and $b_2$ are disposed equally to the right and the left with respect to the Z1-axis. A multipoint approximate shape obtained by connecting the disposed points is a shape measured from the incidence angle. Thus, changing the relative incidence angle between the primary electron beam and the pattern ensures measuring the shape in a portion invisible with the normal incidence.

While in this embodiment, in order to change the incidence angle of the electron beam, the method that the deflector 5 electro-optically inclines the beam is used, a method that causes an XY stage to incline so as to cause the sample to incline is identical. A mechanism that causes the column 1 to incline may be used. Alternatively, the incident angle of the electron beam here can be calibrated using the XY stage or the standard sample. The trajectory is adjusted such that the electron beam has a desired inclined angle, and based on such a calculation, a deflection condition (control value) of the deflector 5 is determined. A preliminarily calibrated deflection condition is stored as the control parameters of the deflector 5, and the beam irradiation is performed at each of a plurality of angles, thereby ensuring automatically executing the measurement using the inclined beam.

While in this embodiment, the relative angle between the sample and the electron beam is the beam incidence angle, a relative angle between the ideal optical axis and the electron beam may be defined as the beam incidence angle. Basically in an ordinary electron beam measuring device (SEM), the electron beam trajectory is set vertical with respect to a moving trajectory (X-direction and Y-direction) of the XY stage. The Z-direction is defined to be 0 degrees, and the inclined angles are indicated by positive and negative numerals in both the X-direction and the Y-direction. Combining X and Y ensures setting angles in any directions.

Fourth Embodiment

In the first embodiment and the second embodiment, it has been described an example of the hole with the taper angle whose dimension at the bottom surface with respect to the top surface is formed small in proportionate to the depth. However, as a shape of sidewalls illustrated in a drawing on a left side in FIG. 14, etching of a deep trench hole may result in processing into a shape called bowing whose change in dimension is not in proportionate corresponding to the depth. Even in the case of such a shape, there is a possibility to cause the device to be inoperable due to adjacent holes connecting with one another. Therefore, feeding back such a cross-sectional shape to a processing device, such as a machining device, is applicable for an improvement in yielding quality items (yield improvement).

Figure 14:
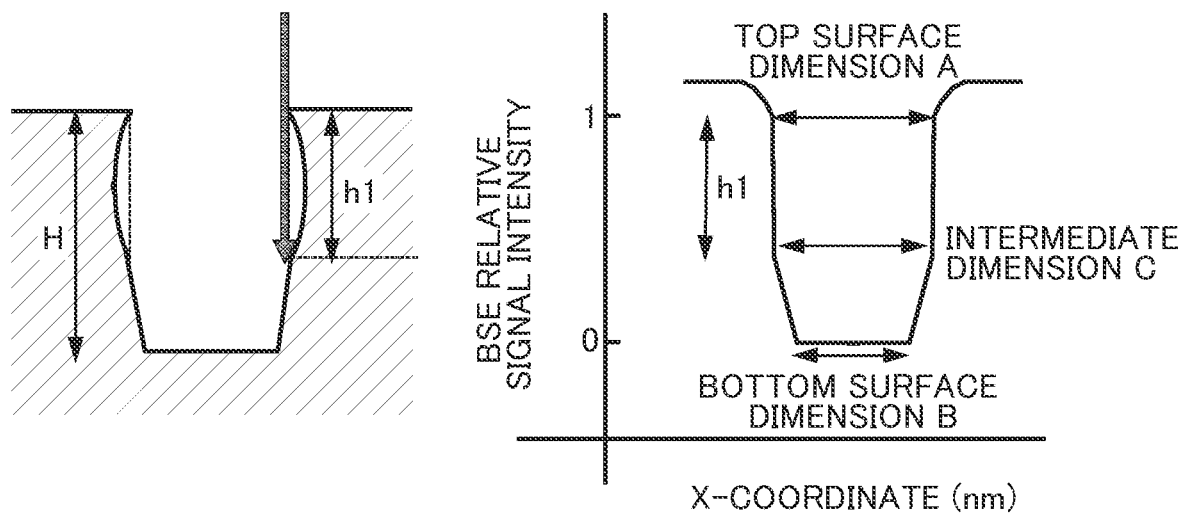
FIG. 14 is a drawing illustrating a BSE profile when a primary beam vertically enters a bowing hole.

With reference to a drawing on a right side in FIG. 14 and the subsequent drawings, a description will be given of a measuring method for a cross-sectional shape of a hole having bowing with a depth H. The drawing on the right side in FIG. 14 is a drawing illustrating a BSE signal intensity when the primary electron beam vertically enters. A change in dimension value from a top surface of the hole to a depth h1 is an intermediate dimension C, and from h1 to a bottom portion has a constant taper angle. A bottom portion dimension is smaller than a top surface dimension.

However, as illustrated in the drawing on the left side in FIG. 14, an actual shape has a change in dimension values in a curved line from the top surface of the hole to the depth h1. The reasons that a difference occurs between the measured shape and the actual shape include, when the primary electron beam vertically enters to the deep hole, there is a region where the primary electron beam does not hit the sidewalls from edges on the top surface of the hole to the depth h1; therefore, BSE signal in the region cannot be detected.

Figure 15A:
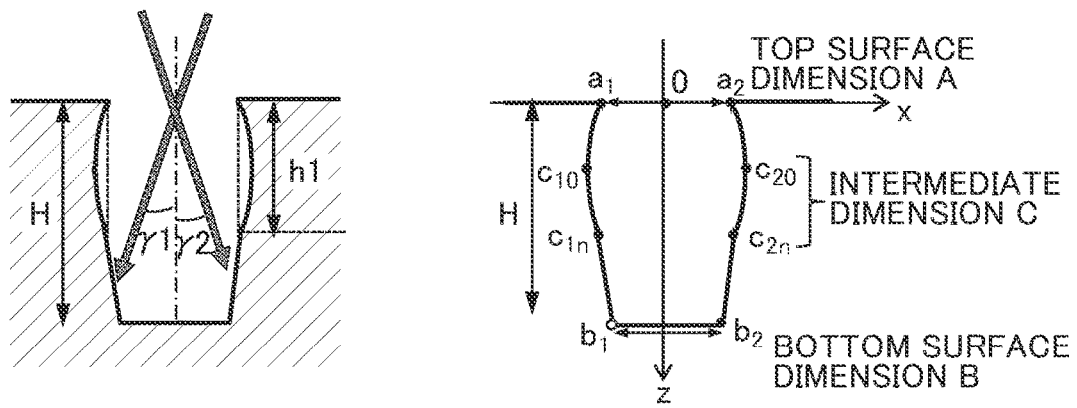
FIG. 15A is a drawing measuring a cross-sectional shape of the bowing hole.

Next, as illustrated in a drawing on a left side in FIG. 15A, a description will be given of a method for changing incidence angles of the beam such that a BSE signal in a portion usually invisible due to a shadow can be detected. For example, setting a plurality of the incidence angles of γ1 and γ2 degrees, and forming respective BSE images based on two-dimensional scanning result in ensuring obtaining a measurement result illustrated in a drawing on a right side in FIG. 15A.

Figure 15B:
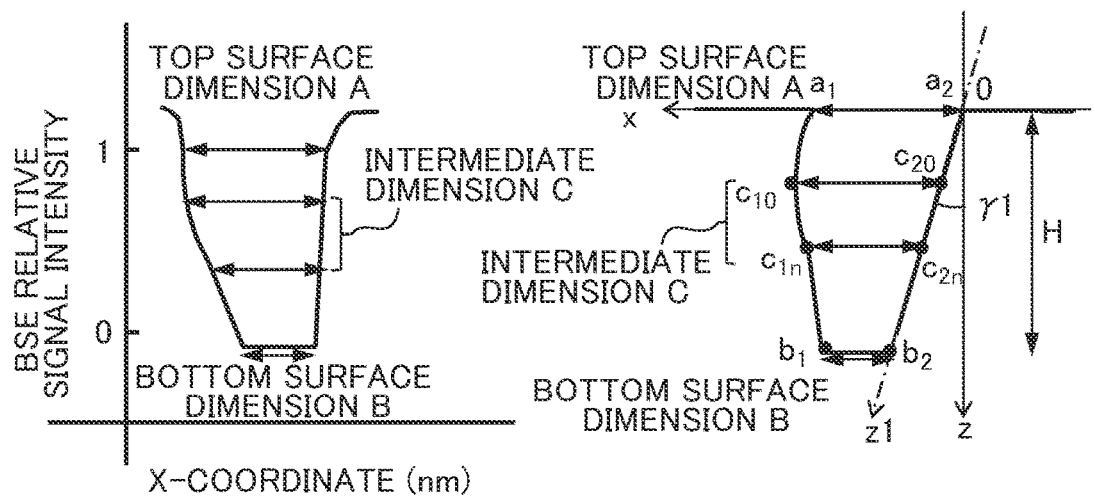
FIG. 15B is a drawing measuring the cross-sectional shape of the bowing hole.
Figure 15C:
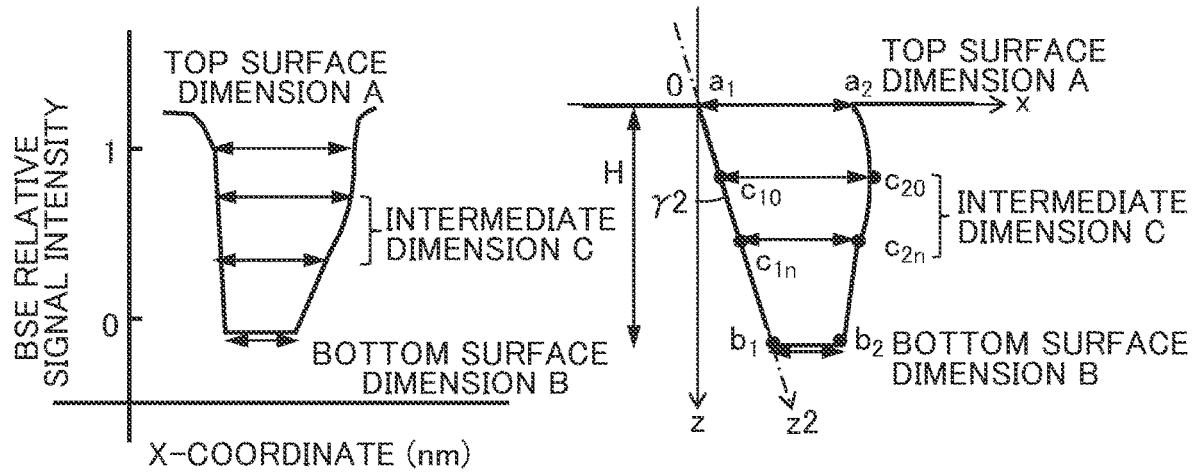
FIG. 15C is a drawing measuring the cross-sectional shape of the bowing hole.

First, respective drawings on left sides in FIG. 15B and FIG. 15C are the BSE signals when the incidence angle of the primary beam is changed to γ1 and γ2 degrees with respect to the pattern. Based on the obtained BSE signals and intensity distributions of the primary electron beams, irradiated regions of the hole are calculated in respective scan positions corresponding to relative incidence angles between the sample and the electron beams. With the process illustrated in FIG. 9, the arithmetic device repeatedly calculates BSE profiles to measure a cross-sectional shape when the sample is irradiated with the plurality of incidence angles.

Then, respective drawings on right sides in FIG. 15B and FIG. 15C are examples of establishing cross-sectional shapes observed from directions in which the incidence angles with respect to the hole have γ1 and γ2 degrees (relative angle of electron beam with respect to Z-direction is γ degrees). A cross-sectional shape can be established based on the relative cross-sectional shape (relative intermediate height and intermediate dimension value positioned at the depth) obtained by the calculation of the measured BSE signal and the absolute depth. With the top surface of the hole being set as an origin of the Z-axis, the obtained absolute depth H is disposed in the Z-axis direction. Then, a Z1-axis and a Z2-axis are disposed such that the incidence angles with respect to the Z-axis have γ1 and γ2 degrees. Based on the top surface of the hole, the absolute depth is calculated from the relative intermediate height. In order to obtain a dimension value positioned at the depth, from $c_{10}$ and $c_{20}$ to $c_{1n}$ and $c_{2n}$ are disposed along the Z1-axis and the Z2-axis and in order to obtain the bottom surface dimension, $b_1$ and $b_2$ are disposed along the Z1-axis and the Z2-axis. A multipoint approximate shape obtained by connecting the disposed points is a shape measured from the incidence angles. The drawing on the right side in FIG. 15A is a reconfiguration of halves of the multipoint approximate shapes in the drawing on the right side in FIG. 15B and the drawing on the right side in FIG. 15C by overlaying and matching positions $a_1$ and $a_2$ on the top surfaces. The dimensions (A, B, and C) at respective depths can be obtained from distances at positions ($a_1$ and $a_2$, . . . $b_1$ and $b_2$) disposed at the respective depths.

Fifth Embodiment

Use of Synchronization of SE Image and BSE Image

While the above-described embodiments have mainly described the method for measuring the cross-sectional shape or the three-dimensional shape only with the BSE image, both the SE image and the BSE image configured of detection information of the secondary electrons may be used. Since the secondary electrons has a feature of including much information on a surface of a substance, using the SE image ensures enhanced measurement accuracy of a top surface position and a top surface dimension compared with the use of the BSE image. Synchronizing and simultaneously obtaining the SE image and the BSE image on the device causes pixels constituting the images to show identical positions, thereby ensuring performing a measurement of the dimension of the top surface and a displaced amount between the top and the bottom similarly to when the BSE image is used.

Figure 16A:
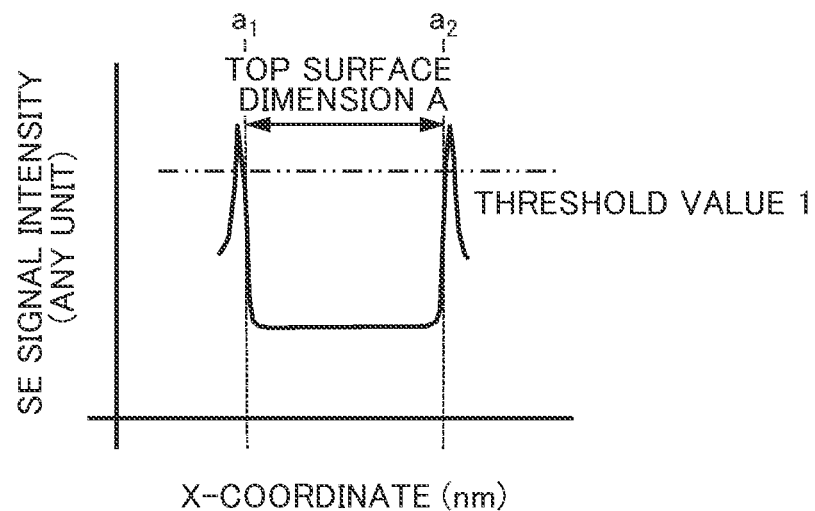
FIG. 16A is a drawing illustrating a measuring method for a cross-sectional shape of a deep hole or a deep trench from profiles of different electron signals.

For example, as illustrated in FIG. 16A, in order to measure the respective dimensions of the top surface and the bottom surface of the hole, setting the threshold value 1 based on the SE image ensures calculating a difference between intersection points $a_1$ and $a_2$ in the x-coordinate as the top surface dimension A. Simultaneously, in the BSE profile obtained from the BSE image, intersection points $a_1$ and $a_2$ that form a similar dimension A are extracted to determine a position of the top surface of the hole that serves as a criteria of the depth.

Figure 16B:
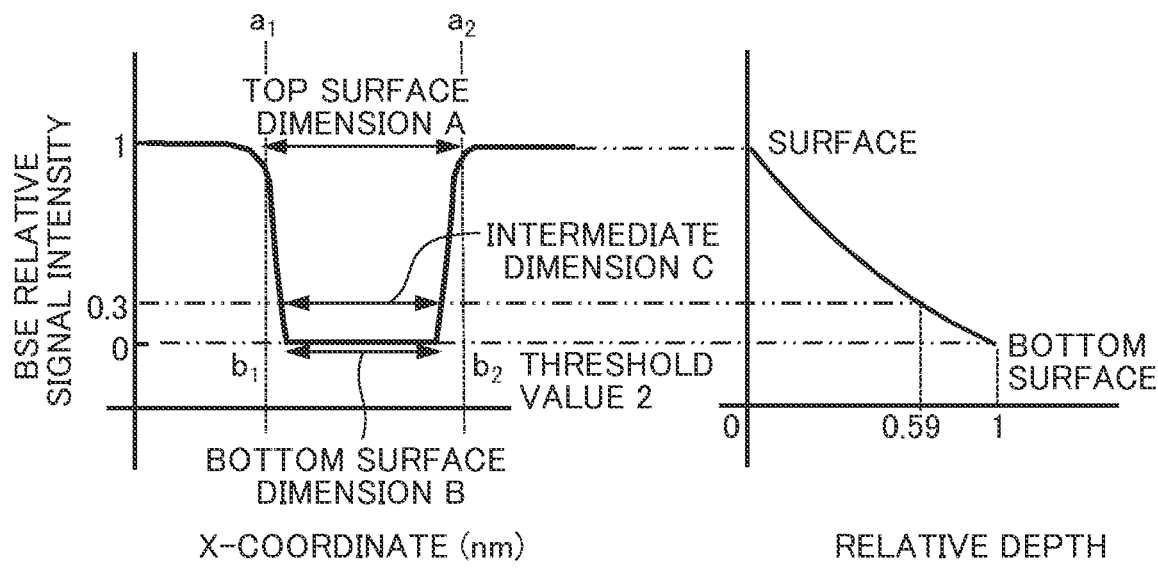
FIG. 16B is a drawing illustrating the measuring method for the cross-sectional shape of the deep hole or the deep trench from the profiles of the different electron signals.

FIG. 16B illustrates a BSE profile relatively standardized by setting the BSE signal intensity of $a_1$ and $a_2$ to 1 and the BSE signal intensity of a lower portion corresponding to the bottom surface to 0. The standardized BSE profile signal intensity is a function of a relative depth of the hole; therefore, using the relationship information of (Formula 2), the relative depth and a dimension positioned at the depth can be continuously obtained in at different threshold values to calculate the relative cross-sectional shape.

Figure 17A:
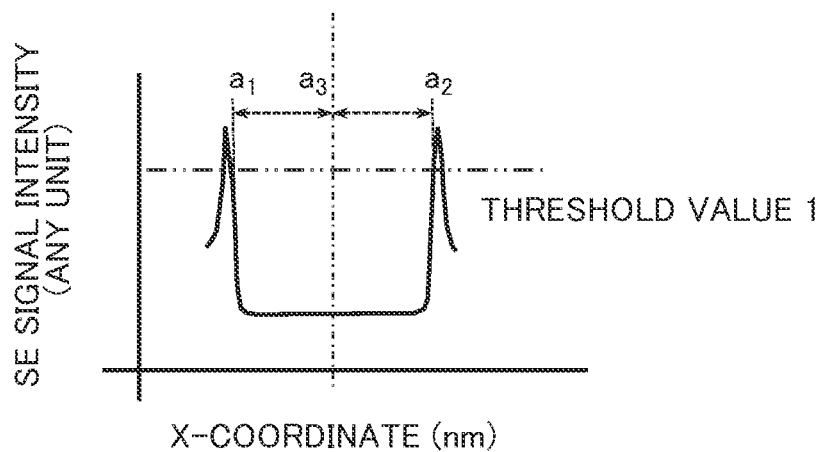
FIG. 17A is a drawing illustrating a method for measuring an absolute depth of the deep hole or the deep trench by the profiles of the different electron signals.
Figure 17B:
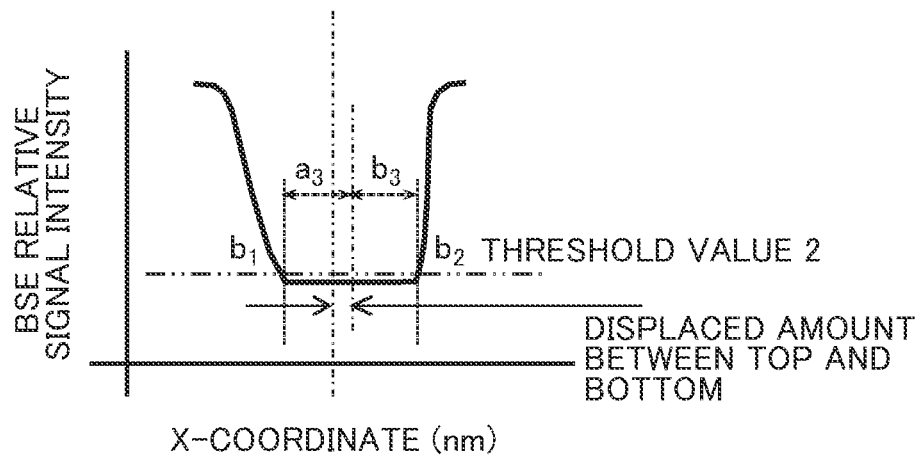
FIG. 17B is a drawing illustrating a method for measuring the absolute depth of the deep hole or the deep trench by the profiles of the different electron signals.

FIG. 17A and FIG. 17B are drawings illustrating examples to calculate the centers of the top surface and the bottom surface by simultaneously using the SE image and the BSE image. Setting the threshold value 1 using the profile of the SE image ensures calculating the intersection points $a_1$ and $a_2$. Setting the threshold value 2 using the profile of the BSE image ensures calculating the intersection points $b_1$ and $b_2$. The threshold value 1 is preferred to be high within a range where the noise of the signal does not bury the threshold value 1, and the threshold value 2 is also set to be at a low position within a range where the noise does not bury the threshold value 2. $(a_1+a_2)/2$ and $(b_1+b_2)/2$ are obtained as the centers of the top surface and the bottom surface. A center position between $a_1$ and $a_2$ is $a_3$ and a center position between the intersection points $b_1$ and $b_2$ is $b_3$. From respective coordinate values at the center positions of $a_3$ and $b_3$, the displaced amount between the top and the bottom can be calculated. Next, using the displaced amount between the top and the bottom and the relationship information on the incidence angle, the absolute depth can be obtained.

The embodiments of the present invention have been described with reference to the drawings above. However, the present invention is not interpreted limited to the content of the embodiments described above. It is possible to change its specific configuration without departing from the thought and the technical scope of the present invention.

The position, the size, the shape, the range, and the like of each configuration illustrated in the drawing and the like sometimes do not represent actual position, size, shape, range, and the like, for ease of understanding of the invention. Accordingly, the present invention is not limited to the position, the size, the shape, the range, and the like disclosed in the drawing and the like.

In the embodiments, control lines and information lines that are considered necessary for explanation are illustrated, and thus, not all the control lines and the information lines on the product are necessarily illustrated. For example, all the configurations may be mutually coupled.

While the measuring device and the processing device that calculates the information obtained with the measuring device are described as different configurations, the measuring device may be incorporated in the processing device, or they may be physically installed in remote locations from one another by coupling them on the network. The system may include identical or a plurality of the measuring devices and the processing devices.

The present invention is not limited to the described embodiments. Various modifications are included in the present invention. The described embodiments describe the configurations in detail for describing the present invention in an easy-to-understand format, and thus, not all the described configurations are necessarily included. It is also possible to perform addition, removal, and replacement of apart of the configurations in each embodiment to another configuration within a range where no conflict occurs.

Each of the configurations, functions, processing units, processing means and the like described above may have a part of or all of them achieved by hardware by, for example, being designed with an integrated circuit. The present invention can be achieved by a program code of software that achieves the functions of the embodiments. In this case, a storage medium recording the program code is provided to a computer, and a processor included in the computer reads out the program code stored in the storage medium. In this case, the program code read out from the storage medium itself achieves the functions of the above-described embodiments, and therefore, the program code itself and the storage medium storing the program code constitute the present invention.

What is claimed is:

1. A measuring system that measures a pattern formed on a sample, the measuring system comprising:
   an irradiation optical system configured to deflect, scan, and irradiate the pattern with a charged particle beam;
   a detector that detects backscattered electrons from the pattern caused by the irradiation;
   a controller configured to control deflection, scanning and irradiation of the pattern with the charged particle beam; and
   a processor programmed to process one or more signal intensities which correspond to the detected backscattered electrons from scanning the charged particle beam at one or more incident angles,
   wherein the processor is further programmed to:
   determine a first displaced amount between a top surface of the pattern and a bottom surface of the pattern from a first signal intensity corresponding to scanning of the charged particle beam at a first incident angle, and
   calculate a depth between the top surface and the bottom surface of the pattern from the first displaced amount and the first incident angle.

2. The measuring system according to claim 1, wherein the processor is further programmed to:
   calculate a cross-sectional shape of a sidewall of the pattern in a scanning direction based on the one or more signal intensities which correspond to the detected backscattered electrons from scanning the charged particle beam in the scanning direction.

3. The measuring system according to claim 2, wherein the controller is configured to change the scanning direction according to a plurality of intersecting directions, and
   the processor is further programmed to:
   calculate a three-dimensional shape of the pattern from the cross-sectional shape of the sidewall in each of the intersecting directions.

4. The measuring system according to claim 1, wherein the processor is further programmed to:
   determine a second displaced amount between the top surface of the pattern and the bottom surface of the pattern from a second signal intensity corresponding to scanning of the charged particle beam at a second incident angle, and
   calculate the depth between the top surface and the bottom surface of the pattern from a difference between the first displaced amount and the second displaced amount and a difference between the first incident angle and the second incident angle.

5. The measuring system according to claim 2, wherein the processor is further programmed to:
   calculate a plurality of positions on the sidewall based on the one or more signal intensities which correspond to the detected backscattered electrons from scanning the charged particle beam in the scanning direction to calculate the cross-sectional shape of the sidewall.

6. A measuring system that measures a pattern formed on a sample, the measuring system comprising:
   an irradiation optical system configured to deflect, scan, and irradiate the pattern with a charged particle beam;
   a first detector that detects backscattered electrons from the pattern caused by the irradiation;
   a controller configured to control deflection, scanning and irradiation of the pattern with the charged particle beam; and
   a processor programmed to process one or more signal intensities which correspond to the detected backscattered electrons from scanning the charged particle beam at one or more incident angles between the charged particle beam and the sample,
   wherein the processor is further programmed to:
   determine a top surface of the pattern and a bottom surface of the pattern from a first signal intensity corresponding to scanning of the charged particle beam in a scanning direction at a first incident angle,
   determine a center of the top surface of the pattern and a center of the bottom surface of the pattern from the first signal intensity,
   determine a first displaced amount between the center of the top surface of the pattern and the center of the bottom surface of the pattern from the first signal intensity, and
   calculate a depth between the top surface and the bottom surface of the pattern from the first displaced amount and the first incident angle incident incident.

7. The measuring system according to claim 6, further comprising:
   a second detector which detects secondary electrons from the pattern caused by the irradiation.

8. The measuring system according to claim 6, wherein the processor is further programmed to:
   calculate a cross-sectional shape of a sidewall of the pattern in the scanning direction based on the one or more signal intensities which correspond to the detected backscattered electrons from scanning the charged particle beam in the scanning direction.

9. The measuring system according to claim 8, wherein the controller is configured to change the scanning direction according to a plurality of intersecting directions, and the processor is further programmed to calculate a three-dimensional shape of the pattern from the cross-sectional shape of the sidewall in each of the intersecting directions.

10. The measuring system according to claim 8, wherein the processor is further programmed to:

calculate a plurality of positions on the sidewall based on the one or more signal intensities which correspond to the detected backscattered electrons from scanning the charged particle beam in the scanning direction to calculate the cross-sectional shape of the sidewall.

11. The measuring system according to claim 6, wherein the processor is further programmed to:

determine the top surface of the pattern and the bottom surface of the pattern from a second signal intensity corresponding to scanning of the charged particle beam in the scanning direction at a second incident angle, determine a center of the top surface of the pattern and a center of the bottom surface of the pattern from the second signal intensity, determine a second displaced amount between the top surface of the pattern and the bottom surface of the pattern from the second signal intensity, and calculate the depth of the pattern from a difference between the first displaced amount and the second displaced amount and a difference between the first incident angle and the second incident angle.

12. A measuring method for measuring a pattern formed on a sample, the method comprising:

deflecting, scanning and irradiating the pattern with a charged particle beam;

detecting backscattered electrons from the pattern by the irradiation in a scanning direction at one or more incident angles;

processing signals which correspond to the detected backscattered electrons from scanning the charged particle beam in the scanning direction at the one or more incident angles, wherein the processing of the signals includes:

determining a first displaced amount between a top surface of the pattern and a bottom surface of the pattern from a first signal intensity corresponding to scanning of the charged particle beam in the scanning direction at a first incident angle, and calculating a depth between the top surface and the bottom surface of the pattern from the first displaced amount and the first incident angle.

13. The measuring method according to claim 12, wherein the processing of the signals further includes:

calculating a cross-sectional shape of a sidewall of the pattern in the scanning direction based on the one or more signal intensities which correspond to the detected backscattered electrons from scanning the charged particle beam in the scanning direction at the one or more incident angles.

14. The measuring method according to claim 13, further comprising:

changing the scanning direction according to a plurality of intersecting directions; and calculating a three-dimensional shape of the sidewall from the cross-sectional shape of the sidewall in each of the intersecting directions.

15. The measuring method according to claim 12, wherein the processing of the signals further includes:

determining a second displaced amount between the top surface of the pattern and the bottom surface of the pattern from a second signal intensity corresponding to scanning of the charged particle beam in the scanning direction at a second incident angle, and calculating the depth between the top surface and the bottom surface of the pattern from a difference between the first displaced amount and the second displaced amount and a difference between the first incident angle and the second incident angle.

* * * * *